United States Patent
Nakata et al.

(10) Patent No.: US 8,659,312 B2
(45) Date of Patent: Feb. 25, 2014

(54) PROBE CARD AND SEMICONDUCTOR WAFER INSPECTION METHOD USING THE SAME

(75) Inventors: Yoshirou Nakata, Tokyo (JP); Naomi Miyake, Osaka (JP)

(73) Assignee: Panasonic Corporation, Osaka (JP)

( * ) Notice: Subject to any disclaimer, the term of this patent is extended or adjusted under 35 U.S.C. 154(b) by 853 days.

(21) Appl. No.: 12/838,849

(22) Filed: Jul. 19, 2010

(65) Prior Publication Data

US 2011/0074455 A1 Mar. 31, 2011

(30) Foreign Application Priority Data

Sep. 25, 2009 (JP) ................ 2009-219857

(51) Int. Cl.
*G01R 31/20* (2006.01)
*G01R 31/312* (2006.01)
*G01R 31/302* (2006.01)

(52) U.S. Cl.
USPC ............ 324/754.15; 324/750.17; 324/754.03; 324/754.21

(58) Field of Classification Search
USPC ............... 324/750.19–750.2, 754.15–754.16
See application file for complete search history.

(56) References Cited

U.S. PATENT DOCUMENTS

| | | | | |
|---|---|---|---|---|
| 5,214,374 A | * | 5/1993 | St. Onge | 324/754.15 |
| 5,412,328 A | | 5/1995 | Male et al. | |
| 5,604,446 A | * | 2/1997 | Sano | 324/754.16 |
| 5,654,631 A | * | 8/1997 | Ames | 324/754.16 |
| 5,945,834 A | | 8/1999 | Nakata et al. | |
| 6,307,390 B1 | * | 10/2001 | Akaike et al. | 324/754.15 |
| 6,316,954 B1 | * | 11/2001 | Venaleck et al. | 324/754.14 |
| 6,603,325 B2 | * | 8/2003 | Maruyama et al. | 324/750.14 |
| 6,690,184 B1 | * | 2/2004 | Akram | 324/754.14 |

(Continued)

FOREIGN PATENT DOCUMENTS

| | | |
|---|---|---|
| JP | 07-231019 | 8/1995 |
| JP | 08-005666 | 1/1996 |
| JP | 2008-526031 | 7/2008 |
| JP | 2009-085720 | 4/2009 |

OTHER PUBLICATIONS

S. Kawai et al., "A 4.7Gb/s Inductive Coupling Interposer with Dual Mode Modem," IEEE Symposium on VLSI Circuits, Dig. Tech. Papers, pp. 92-93, Jun. 2009.

(Continued)

*Primary Examiner* — Joshua Benitez-Rosario
(74) *Attorney, Agent, or Firm* — McDermott Will & Emery LLP

(57) ABSTRACT

A probe card has a thin film substrate having projection electrodes on a first surface facing the semiconductor wafer and at a position facing the pad electrodes, a non-contact electrode, and first electrodes provided a second surface opposite to the first surface; and a wiring substrate having second electrodes disposed at a side opposite to the semiconductor wafer in the thin film substrate and at a position facing the first electrodes. The wiring substrate and the thin film substrate form a first sealed space and the thin film substrate and the semiconductor wafer form a second sealed space. By reducing the pressure in the first and the second sealed space, the first and the second electrodes are brought into close contact with each other and the pad electrodes and the projection electrodes are brought into close contact with each other, and the pressure of each of the first and second sealed space can be independently adjusted.

17 Claims, 17 Drawing Sheets

(56) References Cited

U.S. PATENT DOCUMENTS

| | | | |
|---|---|---|---|
| 7,119,559 B2* | 10/2006 | Beaucage et al. | 324/754.15 |
| 7,227,370 B2* | 6/2007 | Kasukabe | 324/754.15 |
| 8,004,296 B2* | 8/2011 | Di Stefano et al. | 324/750.19 |
| 8,174,279 B2* | 5/2012 | Lee et al. | 324/756.02 |
| 8,183,878 B2* | 5/2012 | Sekino | 324/754.15 |
| 8,368,414 B2* | 2/2013 | Ko | 324/750.16 |
| 2002/0031849 A1 | 3/2002 | Maruyama et al. | |
| 2005/0168234 A1 | 8/2005 | Kwark | |
| 2006/0132167 A1 | 6/2006 | Chen | |
| 2007/0077667 A1 | 4/2007 | Oishi | |
| 2008/0036485 A1* | 2/2008 | Nagai | 324/765 |

OTHER PUBLICATIONS

Y. Yoshida et al., "Wireless DC Voltage Transmission Using Inductive-Coupling Channel for Highly-Parallel Water-Level Testing," IEEE International Solid-State Circuits Conference (ISSCC'09), Dig. Tech. Papers, pp. 470-472, Feb. 2009.

* cited by examiner

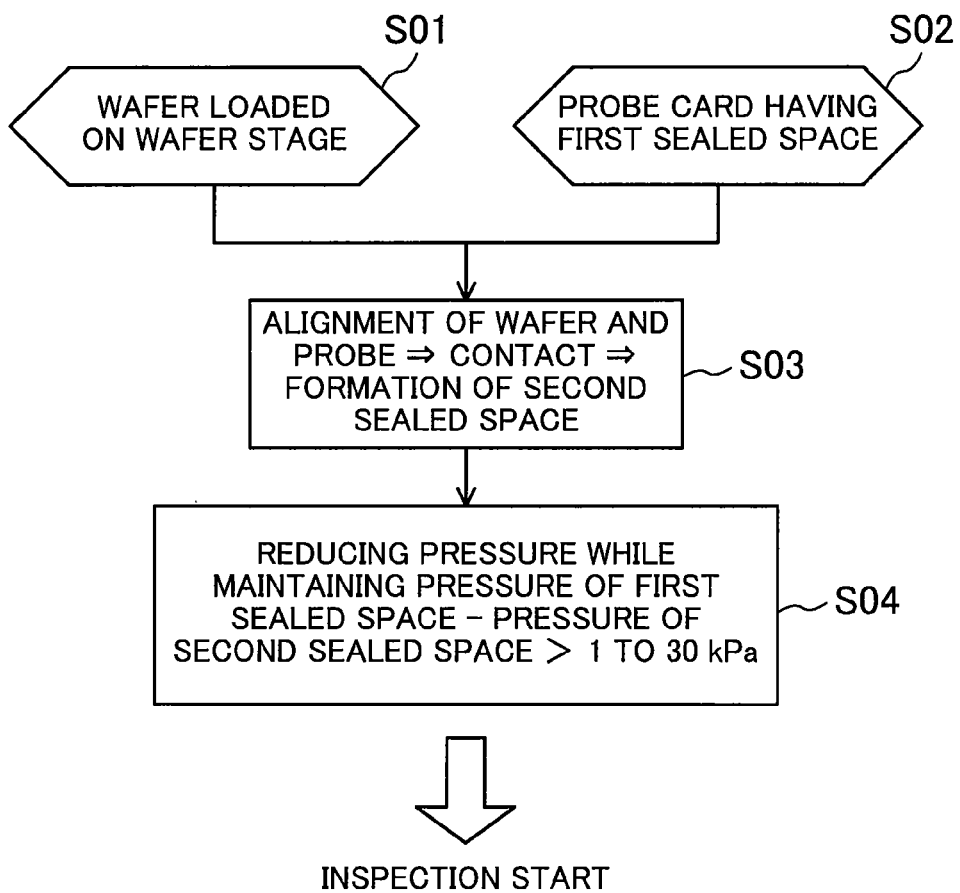

PROBE CARD AND SEMICONDUCTOR WAFER INSPECTION METHOD USING THE SAME

CROSS-REFERENCE TO RELATED APPLICATION

This application claims priority to Japanese Patent Application No. 2009-219857 filed on Sep. 25, 2009, the disclosure of which including the specification, the drawings, and the claims is hereby incorporated by reference in its entirety.

BACKGROUND

The present invention relates to a probe card that collectively inspects a plurality of semiconductor chips in a wafer level and a semiconductor wafer inspection method using the same, and particularly relates to a probe card that performs inspection by transmitting and receiving signals by non-contact coupling, such as inductive coupling or capacitive coupling, and a semiconductor wafer inspection method using the same.

During manufacturing of a semiconductor integrated circuit, a plurality of semiconductor integrated devices (chips) are simultaneously formed through a diffusion process on a semiconductor wafer. However, in the manufacturing process, all the plurality of chips simultaneously manufactured are usually difficult to be made non-defective articles due to various factors, such as dust. Therefore, the manufactured chips need to be individually inspected whether or not the chips are non-defective. The inspection has roughly two sorting processes: inspection for removing defects by actually operating devices and burn in sorting of confirming whether or not the devices have a problem with the reliability also after used in a market for a given period of time.

In order to mount a plurality of chips in one package or to manufacture a device having an increased packaging density by stacking chips in a three dimension manner to connect mutual chips, which is a technique that has been attracting attention in recent years, it is necessary to confirm that each chip is non-defective beforehand. Otherwise, the non-defective ratio of products obtained by integrating a plurality of chips decreases when a larger number of chips are integrated because the total non-defective ratio is determined by the product of the non-defective ratio of each chip.

Therefore, before each chip is mounted, the chips need to be inspected and sorted in a wafer level. As a method therefor, by using a probe card that performs wafer collective contact disclosed in Japanese Patent Publication No. 7-231019 (hereinafter referred to as Document 1) and according to the method disclosed in Japanese Patent Publication No. 8-005666 (hereinafter referred to as Document 2), the probe card is brought into contact with a semiconductor wafer to perform inspection and burn in. The structure of a probe card employing a thin film substrate with a bump that follows changes in the inspection temperature to control the coefficient of thermal expansion to be equal to that of a wafer in the process is also disclosed in Document 1.

In order to obtain electrical connection for each pad electrode of chips, the number of contactable terminals is limited in terms of weight limitation even when the method of Document 2 is used. Therefore, a method for transmitting and receiving signals in a non-contact state using capacitive coupling or inductive coupling that is not limited in the total weight is disclosed in Japanese Patent Publication No. 2009-85720, International Publication No. WO2006/069309 pamphlet, Y. Yoshida, K. Nose, Y. Nakagawa, K. Noguchi, Y. Morita, M. Tago, T. Kuroda, and M. Mizuno, "Wireless DC Voltage Transmission Using Inductive-Coupling Channel for Highly-Parallel Wafer-Level Testing," IEEE International Solid-State Circuits Conference (ISSCC'09), Dig. Tech. Papers, pp. 470-472, February 2009, and S. Kawai, H. Ishikuro, and T. Kuroda, "A 4.7 Gb/s Inductive Coupling Interposer with Dual Mode Modem," IEEE Symposium on VLSI Circuits, Dig. Tech. Papers, pp. 92-93, June 2009, and the like.

SUMMARY

However, when capacitive coupling is used, in the above-described structure such that signals are transmitted and received in a non-contact state, the signal strength is attenuated in inverse proportion to the distance of a connection pad. When inductive coupling is used, there are problems in that the signal strength is notably attenuated, signals from adjacent electrodes cause interference and the like when spaced apart by a distance approximately equal to or larger than the diameter of an inductor.

Accordingly, when communicating using a noncontact probe card or the like, a non-contact probe needs to be brought close to an inspection target chip as much as possible.

In view of the above-described problems, it is an object of the present invention to achieve, when transmitting and receiving signals by capacitive coupling or inductive coupling in a non-contact state to/from a semiconductor wafer, stable transmission and reception of signals by increasing the electromagnetic coupling.

In order to achieve the above-described object, the present invention gives a probe card with a structure such that a first sealed space is formed, the pressure of which is reduced to be lower than the atmospheric pressure, by a wiring substrate and a thin film substrate having a bump electrode or the like, and a second sealed space, the pressure of which is reduced to be lower than the atmospheric pressure, by a thin film substrate and an inspection target semiconductor wafer, in which the pressure of the first sealed space is made higher than the pressure of the second sealed space.

Specifically, the probe card according to the present invention is directed to a probe card that is formed on a semiconductor wafer and collectively inspects a plurality of semiconductor chips each having a plurality of pad electrodes, and the probe card has: a thin film substrate having a plurality of projection electrodes on a first surface facing the semiconductor wafer and at a position facing each of the pad electrodes, a non-contact electrode to be electrically connected to the pad electrodes by capacitive coupling or inductive coupling, and a plurality of first electrodes provided on a second surface opposite to the first surface and electrically connected to each of the projection electrodes and the non-contact electrode; and a wiring substrate having a plurality of second electrodes disposed at a side opposite to the semiconductor wafer in the thin film substrate and at a position facing the first electrodes, in which the wiring substrate and the thin film substrate form a first sealed space and the thin film substrate and the semiconductor wafer form a second sealed space; the first electrodes and the second electrodes are brought into close contact with each other and the pad electrodes and the projection electrodes are brought into close contact with each other by reducing the pressure in the first sealed space and the second sealed space; and the pressure of each of the first sealed space and second sealed space can be independently adjusted.

According to the probe card of the invention, by reducing the pressure of the first sealed space and the second sealed space, the first electrodes and the second electrodes are brought into close contact with each other and the pad electrodes and the projection electrodes are brought close contact with each other, and the pressure of each of the first sealed space and the second sealed space can be independently adjusted. Thus, by adjusting the pressure of the first sealed space to be higher than the pressure of the second sealed space, the thin film substrate contacting both the first sealed space and the second sealed space expands toward the semiconductor wafer. As a result, the non-contact electrode provided on the thin film substrate is brought closer to the pad electrodes formed on the semiconductor chip, and thus the electromagnetic coupling in a non-contact state increases and signals can be stably transmitted and received.

In the probe card of the invention, the pressure of the first sealed space is preferably adjusted to be higher than that of the second sealed space.

The probe card of the invention may further have an anisotropically conductive sheet that is provided between the wiring substrate and the thin film substrate and contains an elastic material conducting in a mutually pressing direction between the first electrode and the second electrode.

In the structure, even when the height of each pad electrode formed on the semiconductor wafer is not uniform, the pad electrodes and the projection electrode can be surely contacted.

The probe card of the invention may further have: a first anisotropically conductive sheet that is provided between the wiring substrate and the thin film substrate and contains an elastic material conducting in a mutually pressing direction of the wiring substrate and the thin film substrate; a pitch conversion substrate that is provided between the wiring substrate and the first anisotropically conductive sheet and has electrodes facing the first electrodes on the side facing the thin film substrate and electrodes facing the second electrodes on the side facing the wiring substrate; and a second anisotropically conductive sheet that is provided between the wiring substrate and the pitch conversion substrate and contains an elastic material conducting in a mutually pressing direction of the wiring substrate and the pitch conversion substrate.

In the structure, even when the types of the inspection target semiconductor wafers vary, the pitch conversion substrate, the second anisotropically conductive sheet, and the thin film substrate may be matched to new types, and the versatility of the probe card (particularly wiring substrate) of the invention can be increased.

In the probe card of the invention, the non-contact electrode is formed on the first surface of the thin film substrate; and the thin film substrate has, on the second surface, a thin film back surface electrode to be electrically connected to the non-contact electrode, in which the thin film back surface electrode may be formed at a position apart from the non-contact electrode by a distance at least 10 times the film thickness of the thin film substrate.

In the structure, a region in the circumference of the non-contact electrode in the thin film substrate can sufficiently extend, and thus the distance from the semiconductor wafer of the non-contact electrode can be surely made small.

In this case, the area of the thin film back surface electrode may be smaller than the area of the first electrodes connected to the projection electrodes.

In the structure, the contact pressure with the semiconductor wafer of the non-contact electrode can be suppressed, and thus the contact pressure of the projection electrodes formed on the thin film substrate and the pad electrodes formed on the semiconductor chip can be increased.

In the probe card of the invention, the non-contact electrode may be formed on the first surface or the second surface of the thin film substrate and at a position apart from the nearest first electrode of the plurality of the first electrodes by a distance at least 10 times the film thickness of the thin film substrate and the thin film substrate has, on the second surface, a thin film back surface electrode to be directly connected to the non-contact electrode.

Also in the structure, the region in the circumference of the non-contact electrode in the thin film substrate sufficiently extends, the distance from the semiconductor wafer of the non-contact electrode can be surely made small.

In this case, the probe card of the invention may further contain an anisotropically conductive sheet that is provided between the wiring substrate and the thin film substrate and contains an elastic material conducting in a pressing direction between the first electrode and the thin film back surface electrode and the second electrode, in which the contact area with the thin film back surface electrode in the anisotropically conductive sheet may be smaller than the contact area with the first electrodes connected to the projection electrodes in the anisotropically conductive sheet.

In the probe card of the invention, when the pitch conversion substrate is provided, the non-contact electrode is an inductor for probing and each semiconductor chip has an inductor for transmission and reception; and the pitch conversion substrate has a first inductor formed on the side of the semiconductor wafer and a second inductor formed on the side of the wiring substrate and electrically connected to the first inductor, in which the first inductor may be provided at a position facing the inductor for transmission and reception and the second inductor may be provided at the position facing the inductor for probing.

In the structure, even when the pitch conversion substrate is provided, signals can be surely transmitted and received between the semiconductor chip and the wiring substrate.

In this case, the first inductor and the second inductor may be connected in such a manner that the mutual current directions may be opposite to each other.

Also in this case, the first inductor and the second inductor may be disposed in such a manner that the center positions are different from each other in the front-back direction of the pitch conversion substrate.

Also in this case, the pitch conversion substrate may contain a magnetic layer at least in a region facing the inductor for transmission and reception.

Thus, interference of signals from other adjacent inductors can be prevented.

In the probe card of the invention, when the pitch conversion substrate is provided, the non-contact electrode is an inductor for probing and each semiconductor chip has an inductor for transmission and reception; the inductor for probing and the inductor for transmission and reception are opposite to each other; and the pitch conversion substrate may have a via containing a magnetic material in the direction of penetrating the pitch conversion substrate between the inductor for transmission and reception and the inductor for probing.

In the structure, diffusion of a magnetic field can be prevented, and thus a magnetic flux is efficiently led to the inductor for probing to increase the electromagnetic coupling. Thus, stable inspection can be performed.

In the probe card of the invention, the non-contact electrode is an inductor for probing and each semiconductor chip has an inductor for transmission and reception; the inductor for probing and the inductor for transmission and reception are opposite to each other; and the thin film substrate has, on the first surface, a amp bump electrode containing a magnetic material formed in such a manner as to penetrate a region where the inductor for probing is formed.

Also in the structure, diffusion of a magnetic field can be prevented, and thus a magnetic flux is efficiently led to the inductor for probing to increase the electromagnetic coupling. Thus, stable inspection can be performed.

The probe card of the invention may further have a probe chip that is formed in a region facing the thin film substrate in the wiring substrate and communicates with each semiconductor chip through the non-contact electrode.

In the structure, the parasitic capacitance which poses a problem particularly in the case of capacitive coupling can be suppressed to a small level, and thus signals from the non-contact electrode of the thin film substrate can be surely transmitted and received.

In this case, the probe chip may be disposed in a concave portion formed in a region facing the thin film substrate.

Also in this case, the probe chip may be embedded in a region facing the thin film substrate.

A first semiconductor wafer inspection method using the probe card according to the invention includes the steps of: preparing the probe card in which the first sealed space is formed and held between the wiring substrate and the thin film substrate; placing an inspection target semiconductor wafer on a wafer stage, aligning the pad electrodes of each semiconductor chip in the semiconductor wafer and the projection electrodes of the probe card in which the first sealed space is formed; and reducing the pressure between the probe card and the wafer stage in the aligned state to form the second sealed space, in which, in the step of forming the second sealed space, the pressure of the second sealed space is reduced while maintaining that the pressure of the first sealed space is higher than the pressure of second sealed space.

According to the first semiconductor wafer inspection method, the second sealed space is formed after the wiring substrate and the thin film substrate between which the first sealed space is formed are aligned with the semiconductor wafer placed on the wafer stage (wafer chuck). In the step of forming the second sealed space, by reducing the pressure of the second sealed space while maintaining that the pressure of the first sealed space is higher than the pressure of the second sealed space, the thin film substrate contacting both the first sealed space and the second sealed space expands toward the semiconductor wafer. As a result, the non-contact electrode provided on the thin film substrate is brought closer to the pad electrode formed on the semiconductor chip, and thus the electromagnetic coupling in a non-contact state increases to allow stable transmission and reception of signals.

A second semiconductor wafer inspection method using the probe card according to the invention includes the steps of: preparing the probe card in which the first sealed space is formed and held between the wiring substrate and the thin film substrate; placing an inspection target semiconductor wafer on a wafer stage; aligning the pad electrodes of each semiconductor chip in the semiconductor wafer and the projection electrodes of the probe card in which the first sealed space is formed; and reducing the pressure between the probe card and the wafer stage in the aligned state to form the second sealed space, in which the step of forming the second sealed space has a step of reducing the pressure of the second sealed space to be the same as the pressure of the first sealed space, and then increasing the pressure of the first sealed space to be higher than the pressure of second sealed space.

According to the second semiconductor wafer inspection method, the same effects as those of the first semiconductor wafer inspection method are obtained. Moreover, since the pressure of the second sealed space is reduced in such a manner as to be the same as the pressure of the first sealed space, the extension of the thin film substrate can be suppressed. Thus, the position shift of the projection electrodes and the non-contact electrode and the pad electrodes can be prevented.

In the first and second semiconductor wafer inspection methods, a difference between the pressure of the first sealed space and the pressure of the second sealed space is preferably 1 kPa or more and 30 kPa or lower.

As described above, according to the probe card of the invention and the semiconductor wafer inspection method using the same, when signals are transmitted and received to/from the semiconductor wafer by capacitive coupling or inductive coupling in a non-contact state, the electromagnetic coupling further increases, and thus the signals can be stably transmitted and received.

BRIEF DESCRIPTION OF THE DRAWINGS

FIG. 4A is a partial schematic plan view and FIG. 4B is a partial schematic cross sectional view.

FIG. 6A is a partial schematic plan view and FIG. 6B is a partial schematic cross sectional view.

FIG. 7A is a partial schematic plan view and FIG. 7B is a partial schematic cross sectional view.

FIG. 8 is a flow chart of a first semiconductor wafer inspection method using the probe card according to each example embodiment.

DETAILED DESCRIPTION

First Example Embodiment

A probe card according to a first example embodiment will be described with reference to FIG. 1.

Figure 1:
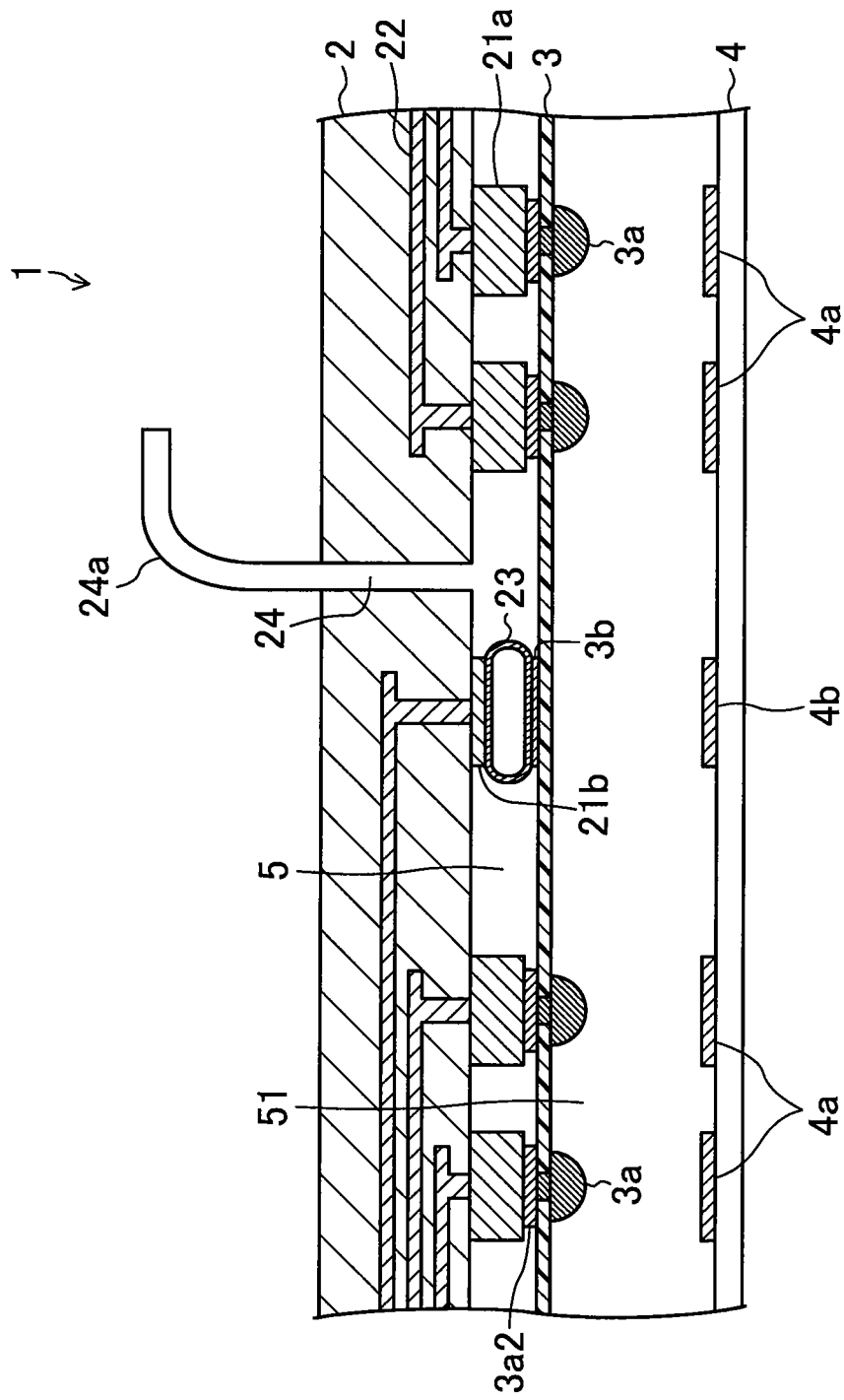
FIG. 1 is a partial schematic cross sectional view of a probe card containing a thin film substrate and a wiring substrate according to a first example embodiment.

As shown in FIG. 1, the probe card 1 according to the first example embodiment contains a wiring substrate 2 and a thin film substrate 3. On the surface facing the thin film substrate 3 in the wiring substrate 2, electrodes 21a and an electrode 21b are formed. The electrodes 21a mainly supply electric power to a wafer 4 which is an inspection target and the electrode 21b transmits and receives inspection signals to/from the wafer 4. Here, the electrodes 21a are preferably formed by plating or the like so that the thickness thereof is larger than that of the electrode 21b.

The thin film substrate 3 is manufactured using, for example, a two-layer base material of a polyimide thin film and a copper thin film or a three-layer base material in which copper thin films are pasted to each other with an adhesive. Laser light or the like is emitted from the polyimide side to form penetration holes through which the copper film is exposed. Furthermore, bump electrodes 3a containing nickel, copper, or an alloy thereof are formed through the penetration holes by an electric field plating method, an electroless plating method, or the like. On the back side of each of the bump electrodes 3a in the thin film substrate 3, bump back surface electrodes 3a2 each to be electrically connected to each of the bump electrodes 3a are formed.

A non-contact pattern 3b for obtaining capacitive coupling or inductive coupling provided on the thin film substrate 3 may be formed by etching the copper thin film of the thin film substrate 3 itself. Moreover, the non-contact pattern 3b may be formed by once removing a region where the non-contact pattern 3b is formed in the copper foil, forming a thin film metal layer again by a sputtering method or the like, and then etching the formed thin film metal layer. When the thin film metal layer is formed by a sputtering method or the like, a thinner metal layer can be formed. Thus, there is an advantage in that fine processing can be achieved. In the case of the thin film metal layer, a finer pattern can be formed by processing using laser light or the like. Thus, the thin film metal layer is suitable for forming an inductor (coil) or the like forming an inductive coupling pattern.

The bump electrodes 3a each are formed at the positions facing the electrodes 21a of the wiring substrate 2 and the pad electrodes 4a for inspection of the wafer 4. The non-contact pattern 3b is formed at the position facing each of the electrode 21b of the wiring substrate 2 and the non-contact pad 4b for inspection of the wafer 4. The non-contact pattern 3b is connected to the electrode 21b of the wiring substrate 2 via a conductive member 23 having flexibility or elasticity. The conductive member 23 having elasticity may be constituted by, for example, a ring-shaped hollow metal member as shown in FIG. 1 or blending conductive particles or a conductive wire into a silicone rubber. The conductive member 23 may be attached so that the thin film substrate 3 is pushed out toward the wafer 4 by the elasticity or the thin film substrate 3 may be attached in such a manner as to maintain an approximately parallel state to the principal surface of the wafer 4. The portion to be electrically connected to the electrode 21b of the wiring substrate 2 and the portion to be electrically connected to the non-contact pattern 3b are preferably fixed by a conductive adhesive or a soldering material. In particular, when connected by the conductive member 23 having flexibility, the portions need to be fixed.

In FIG. 1, the non-contact pattern 3b is a capacitive coupling pattern, which is vertically drawn out from one non-contact pattern 3b by the conductive member 23 having elasticity. When an inductive coupling pattern (inductor) is used in place of the capacitive coupling pattern, a current signal needs to be transmitted to the inductor, and thus the signal current needs to be input from one terminal of the inductor and to be output from the other terminal. Therefore, the electrode 21b is provided on each of the current input side and the current output side. When a plurality of the non-contact pattern 3b that perform inductive coupling are formed in an adjacent manner, one electrode of each inductor can be shared. Thus, the number of the electrodes 21b may be larger by one than the number of inductive coupling patterns. In this case, a pair of electrodes 21b connected to the non-contact pattern 3b forming one inductive coupling are preferably disposed immediately above the non-contact pattern 3b. However, when it is difficult to dispose the same immediately above the non-contact pattern 3b due to a limitation of processing techniques or the pattern shape, the electrodes 21b may not be disposed immediately above the non-contact pattern 3b but are preferably disposed closer to the non-contact pattern 3b as much as possible.

The space sandwiched between the wiring substrate 2 and the thin film substrate 3 is sealed along the outer periphery (not shown) to form a first sealed space 5. In the first example embodiment, the wiring substrate 2 is provided with a penetration hole 24 so that the air pressure of the first sealed space 5 can be arbitrarily adjusted. To the penetration hole 24, a pipe 24a is connected and a pressure adjusting valve (not shown) is connected to the tip.

The space sandwiched between the thin film substrate 3 and the wafer 4 is sealed along the outer periphery to form a second sealed space 51 (not shown).

The probe card 1 structured as described above is aligned with the wafer 4 by an alignment device, and the pad electrodes 4a are connected to the bump electrodes 3a, respectively, of the probe card 1 and the non-contact pad 4b is brought close to the non-contact pattern 3b. Furthermore, by increasing the pressure of the first sealed space 5 to be higher than the pressure of the second sealed space 51 on the wafer 4 through the penetration hole 24, the thin film substrate 3 is expanded toward the wafer 4. Thus, the non-contact pattern 3a provided on the thin film substrate 3 is brought into close contact with the non-contact pad 4b on the wafer 4.

On the wiring substrate 2, a plurality of wirings 22 for inspecting the wafer 4 are provided and are connected to a power supply, a signal generator, a comparator for judging each signal, and the like. As a result of transmitting and receiving inspection signals to/from the non-contact pad 4b provided on the wafer 4 through non-contact coupling, electrical inspection can be carried out. The signals transmitted and received through non-contact coupling are very weak in many cases, and the signals transmitted to the wafer 4 are sensed, amplified, and modulated in the wafer 4 to be used for the inspection of each semiconductor chip in the wafer 4. The signals from the wafer 4 are sensed, amplified, and modulated with a probe chip (not shown) mounted on the probe card 1 to be used for the judgment of inspection results. Since the signals are weak, the probe chip is preferably disposed close to the non-contact pattern 3b of the probe card 1 (wiring substrate 2) as much as possible as described in detail in the sixth example embodiment.

Thus, according to the first example embodiment, signals can be transmitted and received to/from the wafer 4 without substantially requiring a load even when the data volume of a signal wire is large. Thus, more complicated inspection can be achieved and collective inspection of the wafer 4 is facilitated.

Second Example Embodiment

Figure 2:
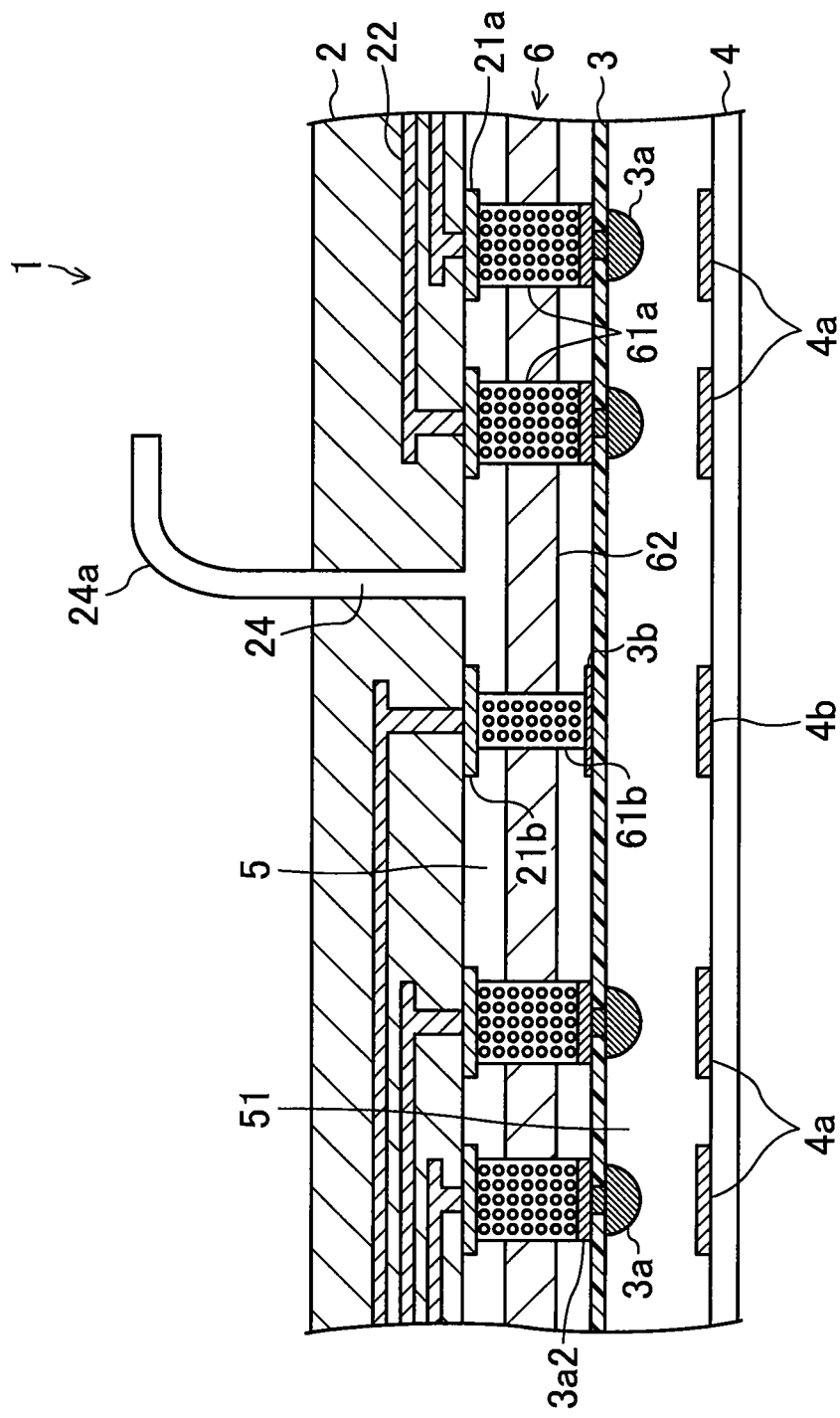
FIG. 2 is a partial schematic cross sectional view of a probe card containing a thin film substrate and an anisotropically conductive sheet according to a second example embodiment.

Hereinafter, a second example embodiment will be described with reference to FIG. 2. In FIG. 2, the same constituent members as those in FIG. 1 are designated by the same reference characters and the description is omitted.

As shown in FIG. 2, the second example embodiment is different from the first example embodiment in that an anisotropically conductive sheet 6 containing an elastic material through which the bump electrodes 3a and the electrodes 21a and the non-contact pattern 3b and the electrode 21b are electrically connected to each other only in the pressing direction is provided between the wiring substrate 2 and the thin film substrate 3.

The anisotropically conductive sheet 6 is a member that connects the wiring substrate 2 and the thin film substrate 3 while having elasticity and contains a material having insulation properties in the in-plane direction of the sheet and having conductivity in the direction perpendicular to the principal surface of the sheet.

Examples of the materials and structures having such properties include:
1) a structure such that conductive particles are localized and dispersed in elastic materials, such as silicone rubber, and then compressed, so that the conductive particles contact each other, whereby electrical connection is achieved only in the compression direction;
2) a structures such that a conductive wire is embedded in an elastic material, such as silicone rubber, in the direction perpendicular to the principal surface and both ends are exposed, and
3) a structure such that penetration holes are selectively formed in a porous resin material containing Teflon or the like having elasticity, and the inner wall of the penetration holes is covered with a conductive material in such a manner as to leave the elasticity.

By disposing the anisotropically conductive sheet 6 having elasticity between the wiring substrate 2 and the thin film substrate 3, the variation in the height of the bump electrodes 3a provided on the thin film substrate 3, the curvature and irregularities of the wiring substrate 2, and the like are absorbed. Thus, the electrical connection between the semiconductor wafer 4 and the wiring substrate 2 can be stably achieved.

In the second example embodiment shown in FIG. 2, the anisotropically conductive sheet 6 having the structure described in 1) above is used. It is a matter of course that when materials having the structures of 2) and 3) above and showing the same properties as those of the anisotropically conductive sheet 6 are used in place of the structure of 1) above, the same effects can be obtained.

The anisotropically conductive sheet 6 shown in FIG. 2 is further provided with conductive parts 61a and 61b facing the bump electrodes 3a and the like by locally disposing conductive particles. The conductive parts 61a and 61b are held by a frame 62 containing a rigid material whose linear expansion coefficient is adjusted to be close to the linear expansion coefficient of silicon (Si). Thus, not only that the initial position accuracy is secured but also that the position accuracy can be maintained at a high level to the measurement temperature during measurement of an inspection. The conductive parts 61a and 62b locally disposed on the anisotropically conductive sheet 6 are preferably formed projecting from the principal surface of the frame 62. Thus, a higher pressing force for ensuring the contact between the particles constituting the conductive parts 61a and 62b can be secured.

During pressing, the conductive parts 61a are electrically connected to the bump electrodes 3a of the thin film substrate 3 and the conductive part 61b is electrically connected to the non-contact pattern 3b of the thin film substrate 3. Here, the cross sectional area of the conductive part 61b to be connected to the non-contact pattern 3b is preferably smaller than the cross sectional area of the conductive parts 61a to be connected to the bump electrodes 3a. This results from the fact that the non-contact pattern 3b does not require electrical connection by contacting and this is because a high pressing force is not required due to contacting portions where the bump electrodes 3a are not formed on the thin film substrate 3 and there is no necessity of applying a high current unlike a power supply or the like.

Third Example Embodiment

Figure 3:
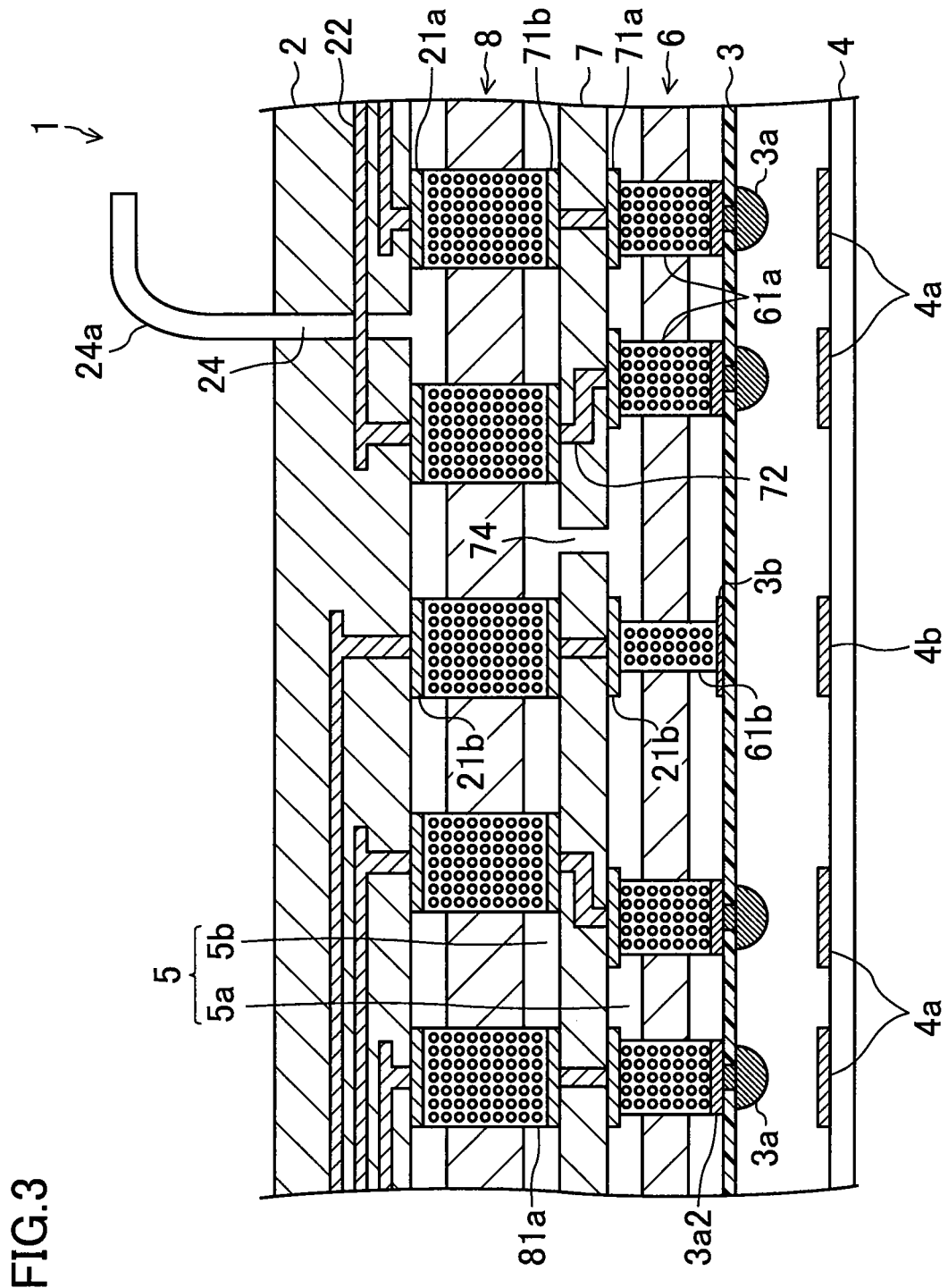
FIG. 3 is a partial schematic cross sectional view of a probe card containing a thin film substrate, an anisotropically conductive sheet, a pitch conversion substrate, and a wiring substrate according to a third example embodiment.

Hereinafter, a third example embodiment will be described with reference to FIG. 3. In FIG. 3, the same constituent members as those in FIG. 1 are designated by the same reference characters and the description is omitted.

As shown in FIG. 3, the third example embodiment is different from the second example embodiment in that a pitch conversion substrate 7 and a second anisotropically conductive sheet 8 containing an elastic material is disposed between the wiring substrate 2 and the anisotropically conductive sheet 6 containing an elastic material (here referred to as the first anisotropically conductive sheet 6).

With the structure, even when the type of the wafer 4 as an inspection target varies and, with the variation, the arrangement of the pad electrodes 4a and the non-contact pad 4b varies, the wiring substrate 2 does not need to change whenever the type thereof varies and only the thin film substrate 3, the first anisotropically conductive sheet 6, and the pitch conversion substrate 7 may be merely replaced by those corresponding to the new type. More specifically, the type of the wafer 4 can be changed easily and at a low cost. Also in the wiring substrate 2, the electrodes 21a and 21b corresponding to the electrode pads 4a, the non-contact pad 4b, and the like on the wafer 4 do not need to be finely processed. Thus, also in this respect, the probe card 1 can be produced at a low cost.

The structure of the pitch conversion substrate 7 will be described in detail. For example, on the surface facing the wafer 4, a plurality of pitch conversion electrodes 71a facing the pad electrodes 4a of the wafer 4 are formed and, on the surface that is the back surface and faces the wiring substrate 2, a plurality of back surface electrodes 71b having an increased pitch are formed. The pitch conversion electrodes 71*a* and the back surface electrodes 71*b* each are electrically connected by internal wirings 72.

Moreover, as shown in FIG. 3, spaces 5*a* and 5*b* of both surfaces of the pitch conversion substrate 7 are sealed along the outer periphery (not shown) to form a first sealed space 5. In the pitch conversion substrate 7, a penetration hole 74 that connects the spaces 5*a* and 5*b* is preferably selectively formed. Thus, the air pressure of the first sealed space 5 can be arbitrarily adjusted from the outside through the penetration hole 24 provided in the wiring substrate 2. However, the penetration hole 74 to be provided in the pitch conversion substrate 7 is not essential and the spaces 5*a* and 5*b* may communicate in the peripheral part of the pitch conversion substrate 7. The advantages of forming the penetration hole 74 in the pitch conversion substrate 7 resides in that the pressure difference between the spaces 5*a* and 5*b* of both surfaces of the pitch conversion substrate 7 is promptly cleared.

For the materials constituting the second anisotropically conductive sheet 8, the same materials and structures as those of the first anisotropically conductive sheet can be used. Conductive parts 81*a* locally disposed on the second anisotropically conductive sheet 8 each are disposed in such a manner as to contact the electrodes 21*a* and 21*b* on the side of the wiring substrate 2 and contact the back surface electrodes 71*b* on the side of the pitch conversion substrate 7.

Hereinafter, the structure and the optimal arrangement of the non-contact pattern 3*b* on the thin film substrate 3 will be described with reference to FIGS. 4A and 4B.

Figure 4A:
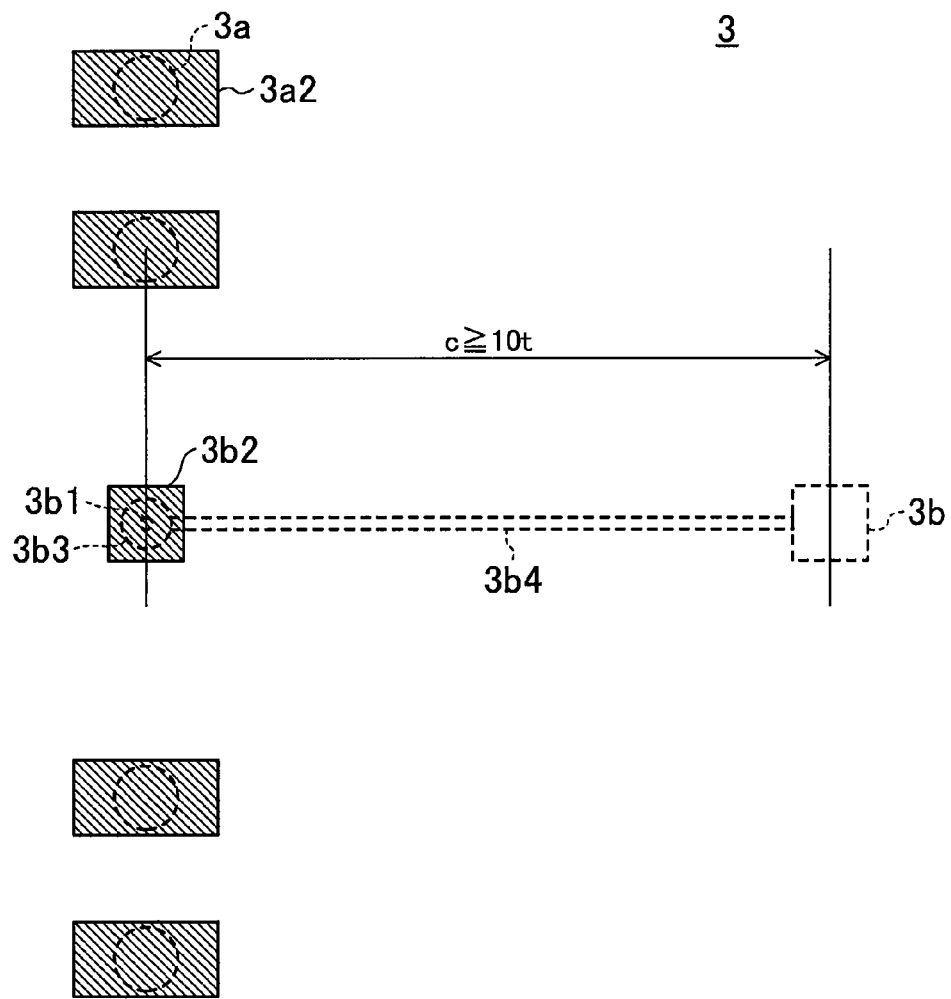
FIGS. 4A and 4B show an example of a non-contact pattern of a thin film substrate for use in the probe card according to each example embodiment.
Figure 4B:
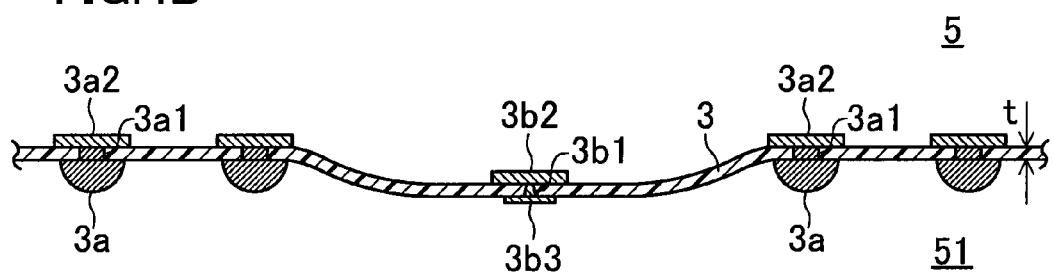

FIG. 4A shows the plane structure (as viewed from the back surface of the bump electrode 3*a*) of the thin film substrate 3 and FIG. 4B schematically shows the cross-sectional structure of the thin film substrate 3 when a differential pressure is applied to the first sealed space 5 and the second sealed space 51.

The bump electrodes 3*a* are connected to the bump back surface electrodes 3*a*2 through penetration holes 3*a*1 provided in the thin film substrate 3.

In contrast, the non-contact pattern 3*b* is formed on the wafer side (bump electrode 3 side) of the thin film substrate 3 in such a manner as to be closer to the wafer and is drawn out to the vicinity of the bump electrodes 3*a* via a non-contact pattern wiring 3*b*4. A surface electrode 3*b*3 connected to the non-contact pattern wiring 3*b*4 is connected to a back surface electrode 3*b*2 through a penetration hole 3*b*1 formed in the thin film substrate 3. The back surface electrode 3*b*2 connected to the non-contact pattern 3*b* contacts the conductive member 23 shown in FIG. 1 or the conductive part 61*b* for the non-contact pattern 3*b* in the anisotropically conductive sheet 6 shown in FIG. 2.

As shown in FIG. 4B, by applying a differential pressure to the internal pressure of the first sealed space 5 above the thin film substrate 3 and the second sealed space 51 below the thin film substrate 3, the non-contact pattern 3*b* can be brought close to the wafer (not shown). Therefore, the non-contact pattern 3*b* is preferably disposed apart from a bump line formed with the bump electrodes 3*a* by a distance at least 10 times the thickness t of a base material constituting the thin film substrate 3. For example, when a polyimide having a thickness t of 25 μm is used as the base material of the thin film substrate 3, an interval c is 250 μm or more. When the interval is adjusted to the degree, the thin film substrate 3 can be sufficiently deflected even when the height of the bump electrode 3*a* is adjusted to, for example, 20 μm. Therefore, the non-contact pattern 3*b* can be brought into contact with the wafer without substantially causing position shift relative to the non-contact pad of the wafer.

The interval c is affected by not only the thickness t of the thin film substrate 3 but also the rigidity (Young's modulus) of the thin film base material, the tension of the thin film substrate 3 when the thin film substrate 3 has the tension, the differential pressure between the pressure of the first sealed space 5 and the pressure of the second sealed space, etc. When capacitive coupling is used for the non-contact pattern 3*b*, the capacity of the wiring attenuates the signal level as a parasitic capacitance compared with coupling capacity. Thus, the wiring is preferably shortened as much as possible. Similarly, the line width of the non-contact pattern wiring 3*b*4 is also preferably reduced from the viewpoint of reducing the parasitic capacitance.

Figure 5:
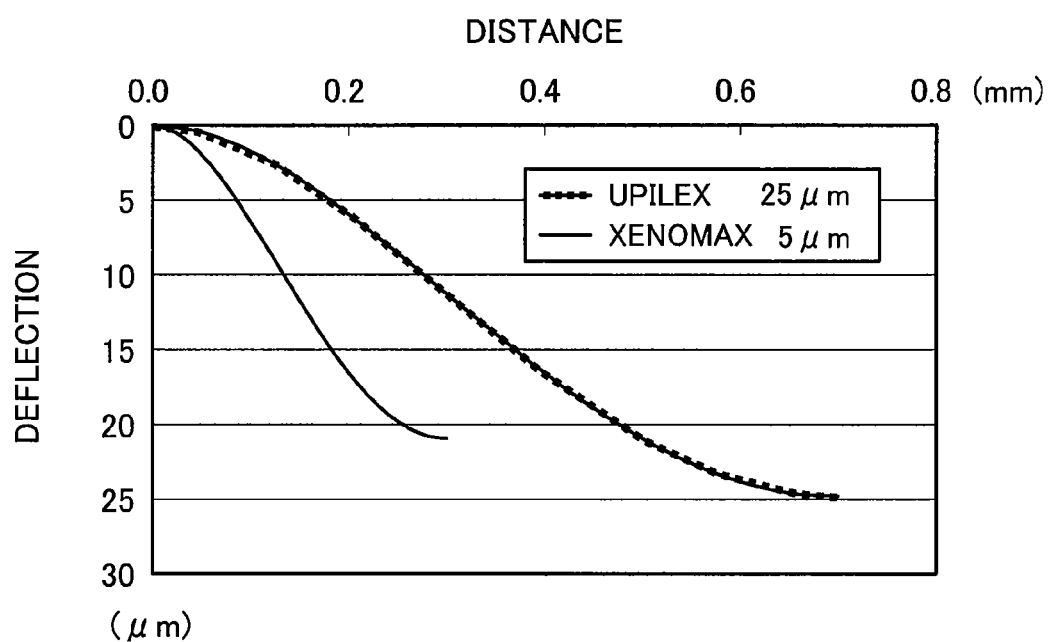
FIG. 5 is a graph of calculation results of a deflection degree by a pressure for every film thickness of the thin film substrate for use in the probe card according to a present disclosure.

FIG. 5 shows calculation results of a differential pressure to be applied to the first sealed space and the second sealed space and a deflection degree of a polyimide film when a polyimide (UPILEX, manufactured by Ube Industries, Ltd.) having a film thickness of 25 μm and a polyimide (XENOMAX, manufactured by Toyobo Co., Ltd.) having a film thickness of 5 μm are used as the base material of the thin film substrate 3. FIG. 5 shows that when the height of the bump electrode is 25 μm and a differential pressure of about 30 kPa is applied to the polyimide film having a film thickness of 25 μm, the polyimide film is brought into close contact with the wafer at the position apart from the bump electrode by only about 700 μm. The extension of the polyimide film at this time is about 0.54 μm.

It is also found that when the height of the bump is 20 μm and the polyimide film has a film thickness of 5 μm and a differential pressure of about 6 kPa is applied, the polyimide film is brought into close contact with the wafer at the position apart from the bump electrode by only about 300 μm. The extension of the polyimide film at this time is about 0.89 μm.

Thus, the position of the non-contact pattern 3*b* shifts by about 0.89 μm under the worst conditions (when the bump electrode is not present on the bump side and the back surface of the non-contact pattern and the polyimide film is brought close to the wafer, and thus the position shift occurs corresponding to the deflection degree). Accordingly, the thin film substrate 3 can be designed and manufactured without substantially considering the position shift.

The back surface electrode 3*b*2 for non-contact pattern is preferably formed so that the area is smaller than that of with the bump back surface electrode 3*a*2. This is because, in the structure, the area in contact with the anisotropically conductive sheet 6 in the back surface electrode 3*b*2 becomes small, and connection can be carried out without strongly pressing the thin film substrate 3. This is because the pad electrodes 4*a* on the wafer that are pressed by the bump electrodes 3*a* to be brought into contact therewith is usually formed with aluminum or the like, and electrical conduction is not achieved without a certain degree of load, and, in contrast thereto, the back surface electrode 3*b*2 for non-contact pattern can achieve stable electrical connection at a low load by performing metal plating or the like.

Hereinafter, a first modification of the non-contact pattern 3*b* will be described with reference to FIGS. 6A and 6B.

Figure 6A:
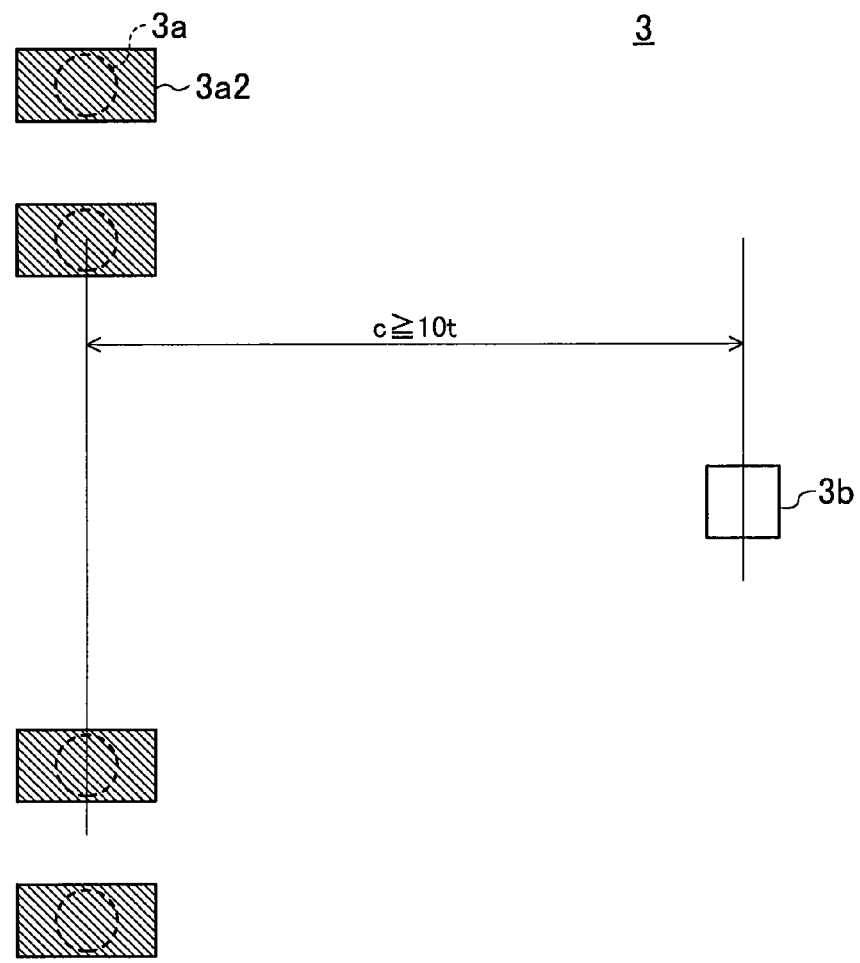
FIGS. 6A and 6B show a first modification of a non-contact pattern of the thin film substrate for use in the probe card according to each example embodiment.
Figure 6B:
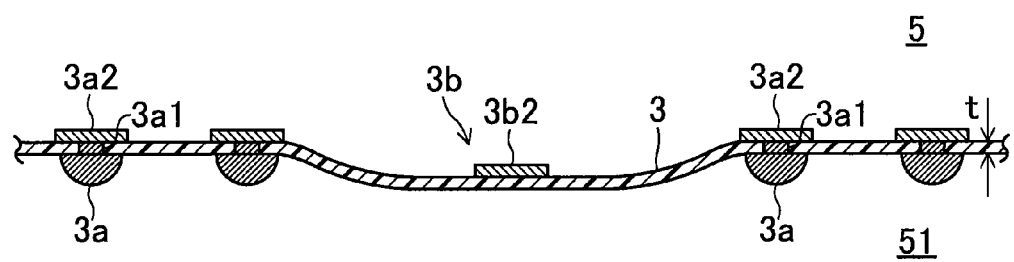

As shown in FIGS. 6A and 6B, the non-contact pattern 3*b* according to a first modification is different from the non-contact pattern 3*b* shown in FIG. 4 in that the surface electrode 3*b*3 is omitted and the back surface electrode 3*b*2 is shared. Thus, the non-contact pattern wiring 3*b*4 and the penetration hole 3*b*1 become unnecessary. The back surface electrode 3*b*2 contacts the conductive member 23 shown in FIG. 1 or the conductive part 61*b* for the non-contact pattern 3*b* on the anisotropically conductive sheet 6 shown in FIG. 2.

According to this modification, since the non-contact pattern wiring 3b4 is not formed, the parasitic capacitance corresponding to the omission can be suppressed at a low level.

Hereinafter, a second modification of the non-contact pattern 3b will be described with reference to FIGS. 7A and 7B.

Figure 7A:
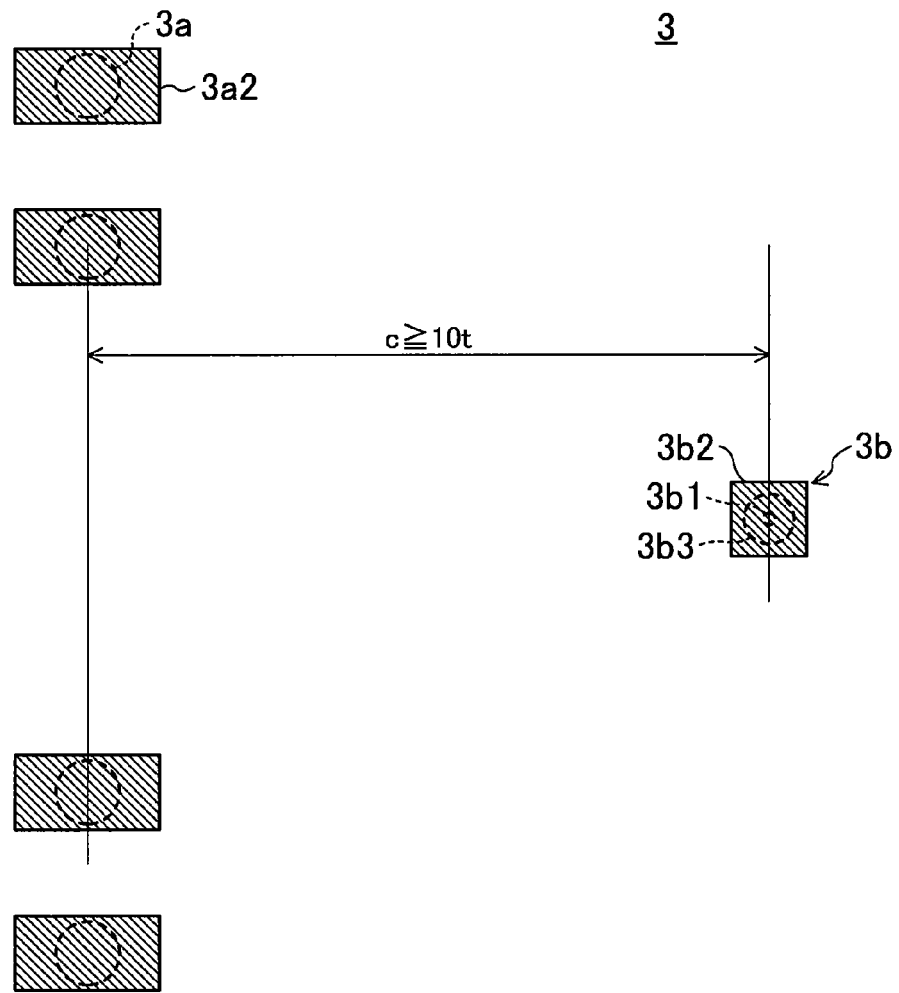
FIGS. 7A and 7B show a second modification of the non-contact pattern of the thin film substrate for use in the probe card according to each example embodiment.
Figure 7B:
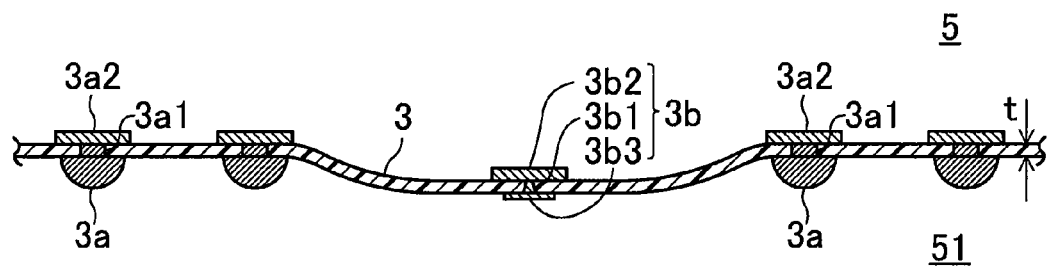

As shown in FIGS. 7A and 7B, the non-contact pattern 3b according to a second modification is different from the non-contact pattern 3b shown in FIG. 4 in that the back surface electrode 3b2 is formed in the non-contact pattern 3b (surface electrode 3b3) itself through the penetration hole 3b1. Accordingly, the non-contact pattern wiring 3b4 becomes unnecessary. The back surface electrode 3b2 contacts the conductive member 23 shown in FIG. 1 or the conductive part 61b for the non-contact pattern 3b on the anisotropically conductive sheet 6 shown in FIG. 2.

In the second modification, when capacitive coupling is used for the non-contact pattern 3b, the distance from the capacitor on the wafer becomes large corresponding to the film thickness of the thin film substrate 3. Thus, a reduction in the coupling capacity is concerned. Accordingly, for the thin film substrate 3, a thin film base material having a large dielectric constant and a small film thickness is preferably used. In order to form the penetration hole 3b1, the thin film base material may be subjected to chemical etching or may be processed by a mechanical physical method including laser light from the back side of the bump electrode 3.

As a more effective aspect of the modifications described using FIGS. 6 and 7, the conductive part 61b for non-contact pattern in the anisotropically conductive sheet 6 to be connected to the back surface electrode 3b2 of the non-contact pattern 3b preferably projects from the principal surface of the sheet. Furthermore, the projection portion is preferably smaller than the projection area of a portion to be connected to the bump back surface electrode 3a2. Thus, conduction with the non-contact pattern 3b can be achieved at a low load.

(First Semiconductor Wafer Inspection Method)

Hereinafter, a first semiconductor wafer inspection method using the probe cards according to the example embodiments 1 to 3 and the modifications thereof will be described with reference to FIG. 8.

As shown in FIG. 8, in a step S01, the wafer 4 on which a plurality of semiconductor chips each containing a semiconductor integrated circuit to be inspected are formed is loaded on the wafer stage (wafer chuck).

Simultaneously therewith, in a step S02, the probe card 1 in which the first sealed space 5 is formed and held between the wiring substrate 2 and the thin film substrate 3 is prepared.

Next, in a step S03, the pad electrodes 4a and the non-contact pad 4b of each semiconductor chip on the wafer 4 and the bump electrodes 3a and the non-contact pattern 3b of the probe card 1 in which the first sealed space 5 is formed are aligned, respectively. Thereafter, they are brought close to each other to bring the probe card 1 and the semiconductor wafer 4 into close contact with each other. During the step, a seal ring provided in the periphery of the wafer 4 on the wafer stage contacts the probe card 1 to form the second sealed space 51 between the wafer 4 (wafer stage) and the probe card 1.

Next, in a step S04, the pressure of the second sealed space 51 is reduced while maintaining the pressure (internal pressure) of the first sealed space 5 to be always higher than the pressure (internal pressure) of the second sealed space 51 by a differential pressure of from about 1 kPa to 30 kPa. When the reduction in the pressure of the second sealed space 51 is completed, the bump vamp electrodes 3a of the thin film substrate 3 contact the pad electrodes 4a of the wafer 4 to obtain electrical conduction and the non-contact pattern 3b of the thin film substrate 3 is brought close to the non-contact pad 4b to form non-contact coupling.

Thus, the probe card 1 and the wafer 4 that are mutually aligned and brought into contact with each other are connected to a tester chip having an inspection function provided on the probe card 1, a probe chip for transmitting and receiving non-contact signals, or a tester disposed outside the probe card 1, and desired inspection is carried out.

During the step, the bump electrodes 3a of the thin film substrate 3 are pressed against the pad electrodes 4a of the wafer 4 by a pressure difference between a pressure difference between the external pressure (usually atmospheric pressure) and the pressure of the second sealed space 51 and a pressure difference of the external pressure (usually atmospheric pressure) and the pressure of the first sealed space 5. Furthermore, the non-contact pattern 3b of the thin film substrate 3 is brought close to the wafer 4 by a pressure difference between the pressure of the second sealed space 51 on the wafer 4 and the pressure of the first sealed space 5 in the probe card 1.

Thus, in the first inspection method, the pressure of the second sealed space 51 is reduced while always giving a differential pressure between the first sealed space 5 and the second sealed space 51. Thus, when the reduction in the pressure is completed, the non-contact pattern 3b is also brought close to the non-contact pad 4b of the wafer 4. Accordingly, immediately after the step, given inspection can be initiated.

(Second Semiconductor Wafer Inspection Method)

Figure 9:
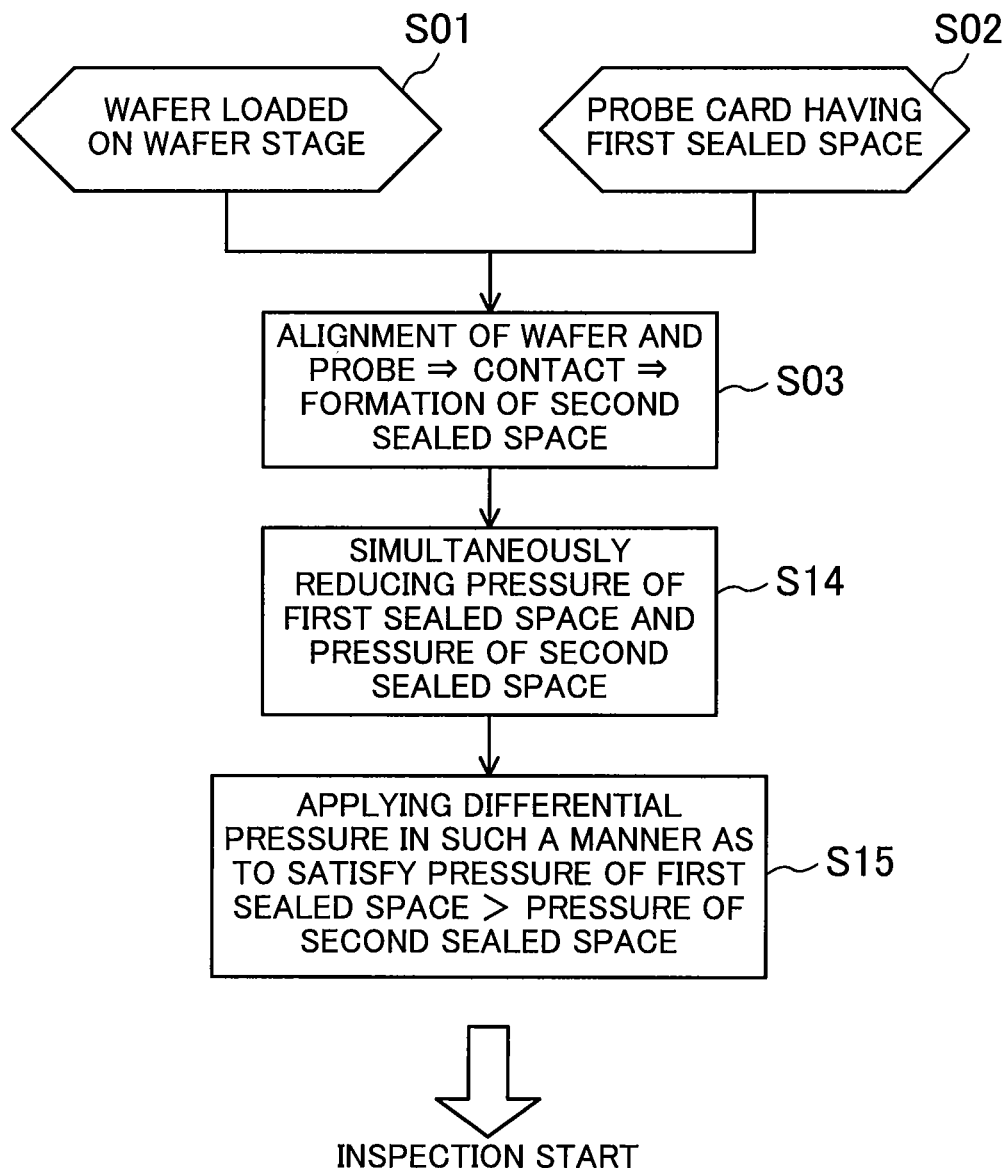
FIG. 9 is a flow chart of a second semiconductor wafer inspection method using the probe card according to each example embodiment.

Hereinafter, a second semiconductor wafer inspection method using the probe cards according to the example embodiments 1 to 3 and the modifications thereof will be described with reference to FIG. 9.

Only steps different from those of the first inspection method shown in FIG. 8 will be described.

First, in a step S03, the second sealed space 51 that is already aligned is formed between the wafer 4 and probe card 1 in the same manner as in the first inspection method.

Subsequently, in a step S14, the pressure of the second sealed space 51 is reduced while maintaining the pressure of the first sealed space 5 to be always equal to the pressure of the second sealed space 51. Thus, the bump electrodes 3a of the thin film substrate 3 contact the pad electrodes 4a of the wafer 4 to obtain electrical conduction.

Next, in a step S15, after the completion of the reduction in the pressure of the first sealed space 5 and the second sealed space 51, a differential pressure is given to the first sealed space 5 so that the pressure of the first sealed space 5 is higher than the pressure of the second sealed space 51 by from about 1 kPa to about 30 kPa. Due to the differential pressure, the non-contact pattern 3b of the thin film substrate 3 is brought close to the non-contact pad 4b of the wafer 4 to form non-contact coupling.

Thus, also in the second inspection method, the probe card 1 and the wafer 4 that are mutually aligned and brought into contact with each other are connected to a tester chip having an inspection function provided on the probe card 1, a probe chip for transmitting and receiving non-contact signals, or a tester disposed outside the probe card 1, and desired inspection is carried out.

Furthermore, in the second inspection method, since the non-contact pattern 3b and the non-contact pad 4b are brought close to each other after the bump electrode 3a are pressed against the pad electrodes 4a, the alignment accuracy can be maintained at a very high level.

Fourth Example Embodiment

Hereinafter, an example of the pitch conversion substrate used in the third example embodiment, which is a probe card according to a fourth example embodiment, will be described with reference to FIG. 10. Here, the pitch conversion electrode 71a and the back surface electrode 71b are omitted.

As described in the third example embodiment shown in FIG. 3, it is highly advantageous in terms of the cost to form a probe chip on a wiring substrate and re-utilize the wiring substrate 2 on which an expensive probe chip is mounted when changing the type of a semiconductor wafer (semiconductor chip) using the pitch conversion substrate 7. However, since the pitch conversion substrate 7 is pressed by the first anisotropically conductive sheet 6 and the second anisotropically conductive sheet 8, the pitch conversion substrate 7 needs to have a certain degree of rigidity. Accordingly, a thickness of about 1 mm is usually required. In contrast, in inductive coupling, mutual inductance becomes rapidly small when being apart by a distance equal to or larger than the diameter of an inductor coil constituting the same. For inductive coupling with the wafer 4, it is assumed to use a coil of about 10 to about 200 μm. A coil having such a dimension is very difficult to be coupled with a probe chip for communication over the pitch conversion substrate 7 having a thickness of about 1 mm.

Figure 10A:
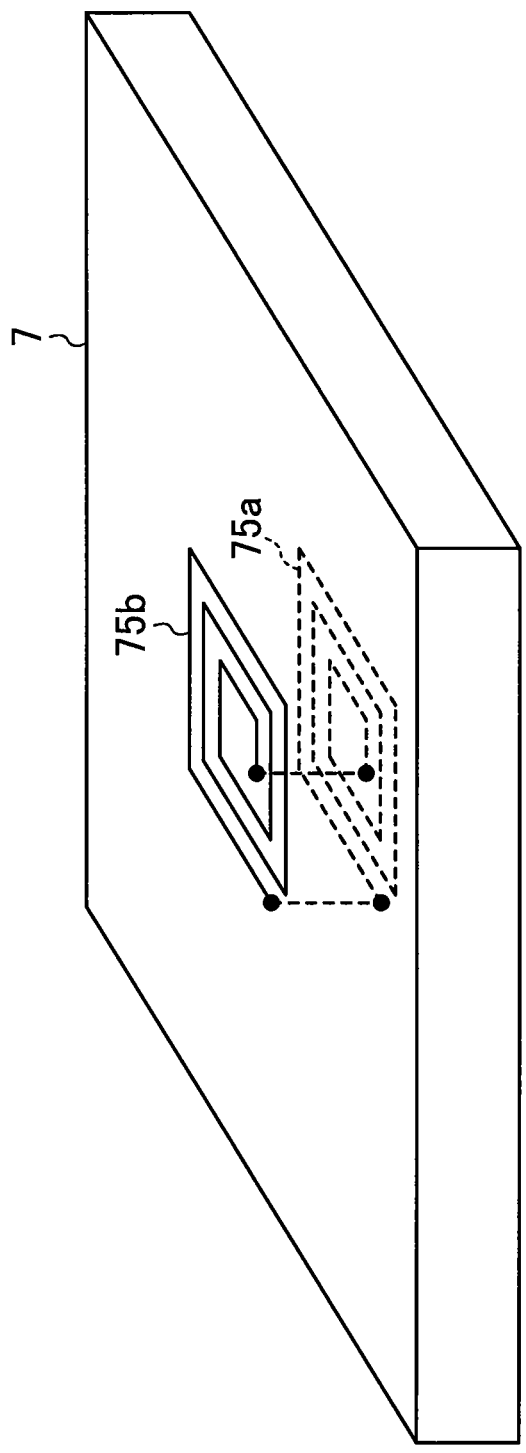
FIG. 10A is a schematic perspective view of an example of the pitch conversion substrate which is a probe card according to a fourth example embodiment.

Then, in this example embodiment, as shown in FIG. 10A, it is preferable that, by forming a first inductor 75a and a second inductor 75b on each of the wafer side and the wiring substrate side in the pitch conversion substrate 7, and then coupling the indictors, both the inductors 75a and 75b be connected by an electrical signal.

Figure 10B:
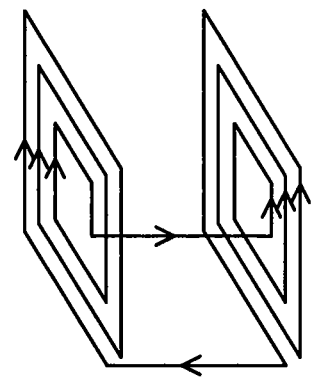
FIG. 10B is a view showing the wire connection direction of inductors.

In this case, as shown in FIG. 10 B, with respect to the winding direction of the coil in both the inductors 75a and 75b, the coil is more preferably wound so that current may flow in the mutually opposite direction. Thus, the direction of a magnetic field formed by a current induced by the first inductor 75a is the same as the direction of a magnetic field formed by the non-contact pad 4b of the wafer. Thus, a mutually cancelling phenomenon can be prevented. The same applies when the magnetic field is changed from the probe chip side to transmit signals to the wafer side.

First Modification of Fourth Example Embodiment

Hereinafter, a first modification of the pitch conversion substrate, which is the probe card according to the fourth example embodiment, will be described with reference to FIG. 11. Here, the pitch conversion electrode 71a and the back surface electrode 71b are also omitted.

Figure 11:
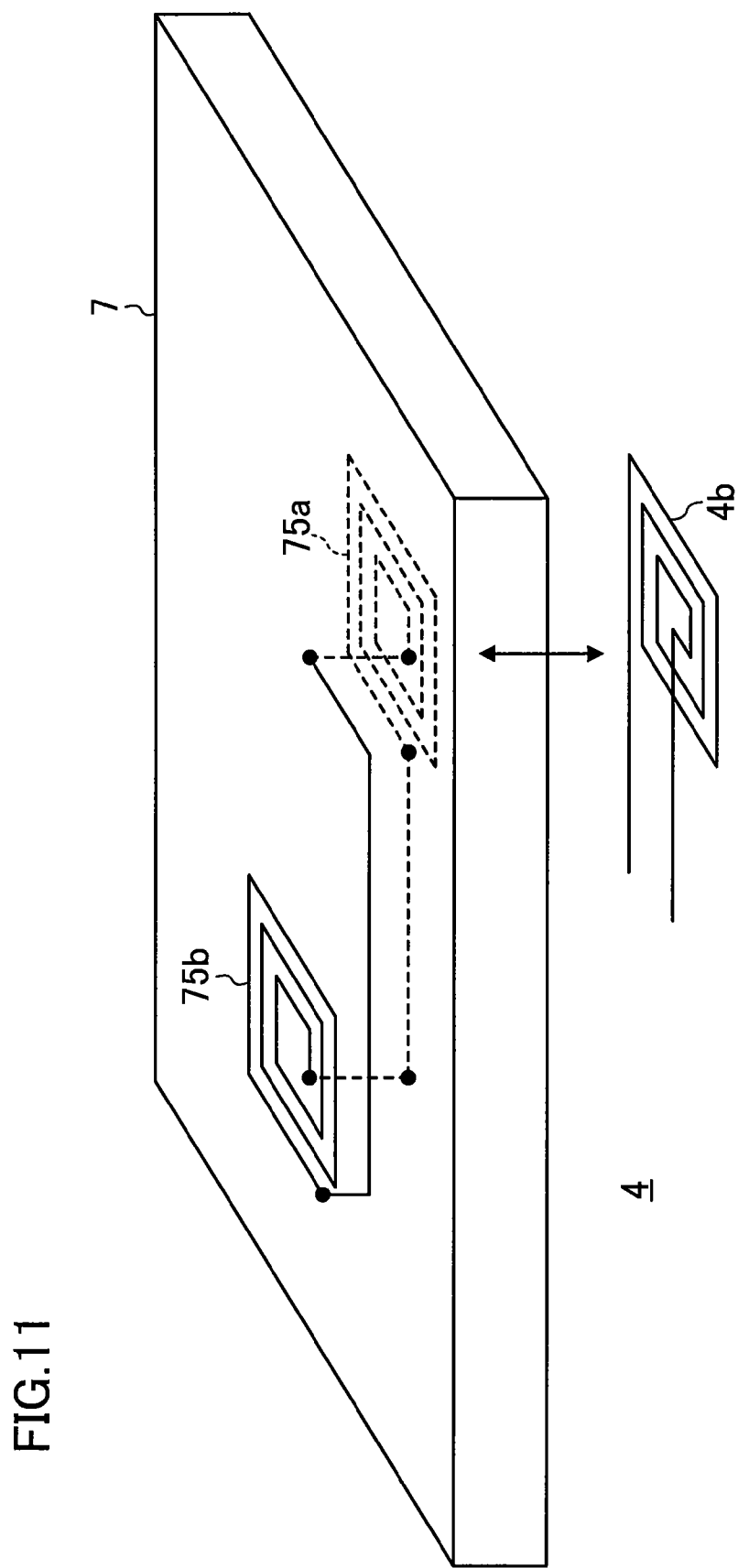
FIG. 11 is a schematic perspective view of a first modification of the pitch conversion substrate, which is the probe card according to the fourth example embodiment.

As shown in FIG. 11, in the first modification, the first inductor 75a and the second inductor 75b provided on both sides of the pitch conversion substrate 7 are not formed on the same axis. More specifically, the first inductor 75a and the second inductor 75b are disposed so that the center positions are different from each other.

Thus, the first inductor 75a facing the wafer 4 can be disposed at the position facing the inductive non-contact pad 4b in the wafer 4 and the second inductor 75b facing the wiring substrate can be disposed at the position facing the probe chip in the wiring substrate. Thus, the first inductor 75a and the second inductor 75b can be disposed at suitable positions.

The current direction when the first inductor 75a and the second inductor 75b in the first modification are connected may be determined as appropriate based on the relationship of the magnetic fields formed by the inductors depending on the positional relationship of the non-contact pad 4b formed on the wafer 4 and the non-contact pattern of the probe chip (not shown) mounted on the wiring substrate.

Second Modification of Fourth Example Embodiment

Hereinafter, a second modification of the pitch conversion substrate, which is the probe card according to the fourth example embodiment, will be described with reference to FIG. 12. Here, the pitch conversion electrode 71a and the back surface electrode 71b are also omitted.

Figure 12:
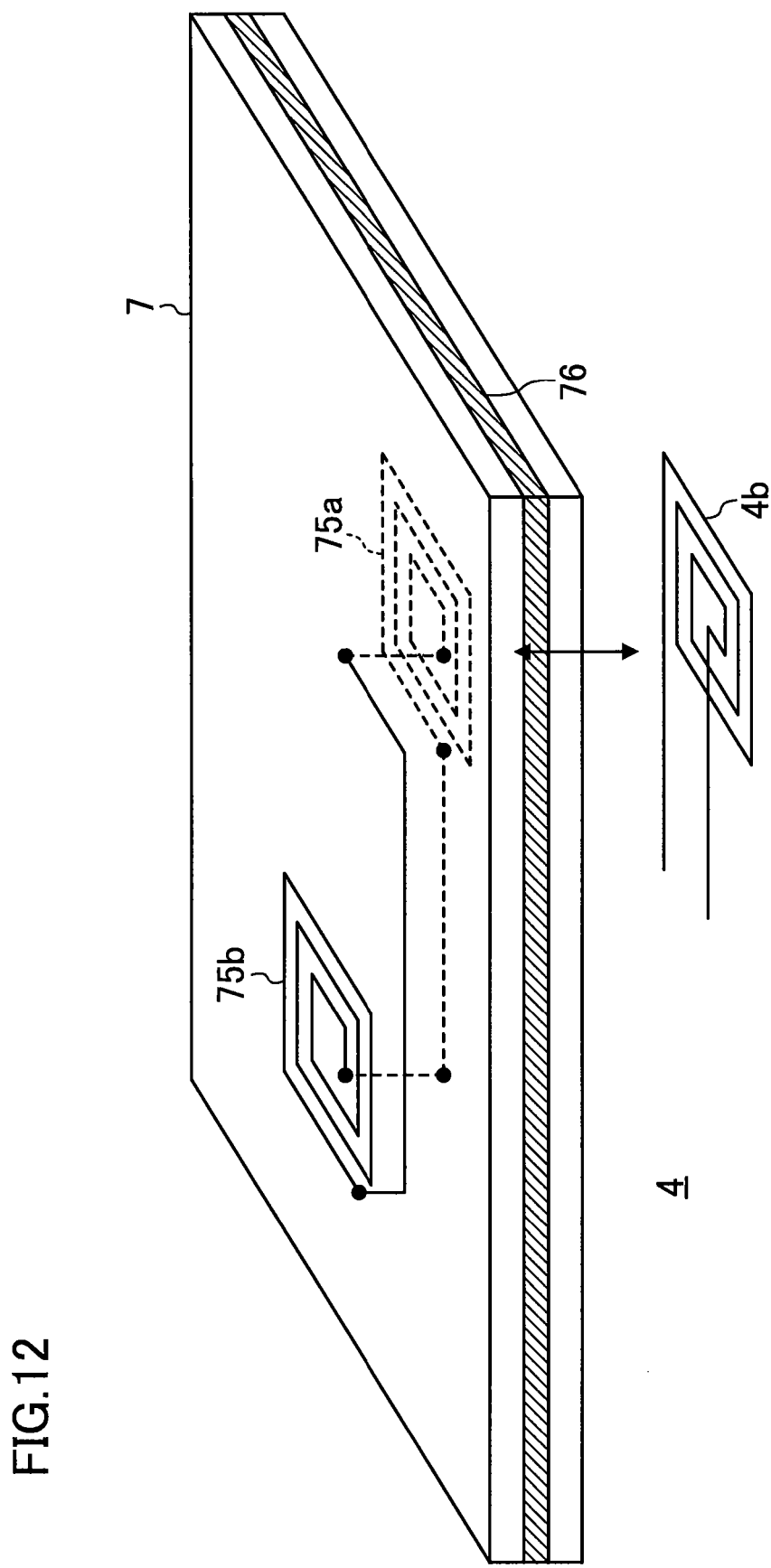
FIG. 12 is a schematic perspective view of a second modification of the pitch conversion substrate, which is the probe card according to the fourth example embodiment.

As shown in FIG. 12, in the second modification, a magnetic layer 76 is formed in the pitch conversion substrate 7 in parallel to the principal surface. The magnetic layer 76 has an effect of shielding the magnetic field, and thus the first inductor 75a and the second inductor 75b for non-contact communication provided on both surfaces of the pitch conversion substrate 7 can shield effects of the magnetic field formed by an electrode pattern for non-contact communication in the probe chip on the wafer 4 or the wiring substrate on the surface which each inductor faces. Here, as an example of the magnetic layer 76, Invar alloy (iron alloy containing about 36% of nickel) can be used.

According to the second modification, the first inductor 75a and the second inductor 75b of the pitch conversion substrate 7 can be disposed on arbitrary positions and can be interconnected without considering the arrangement of the non-contact pad 4b at all. Moreover, in this case, the necessity of considering the interconnection direction is hardly required, and thus the degree of freedom of design can be sharply improved.

The magnetic layer 76 does not need to be formed over the entire surface of the pitch conversion substrate 7 and may cover a region equal to or larger than the plane area of each of the inductor 75a and 75b provided on both surfaces of the pitch conversion substrate 7. Accordingly, the effects can be obtained even when the magnetic layer 76 is formed only in a part of pitch conversion substrate 7 due to limitations of the cost of the magnetic material, the coefficient of thermal expansion coefficient of the magnetic material, the formation of a penetration hole for conducting the front and back sides due to the fact that magnetic material has conductivity, and the like.

The magnetic material for use in the magnetic layer 76 preferably has a high magnetic permeability and a small residual magnetic field. Thus, energy loss during high frequency communication can also be suppressed.

Third Modification of Fourth Example Embodiment

Hereinafter, a third modification of the wiring substrate and the pitch conversion substrate, which is the probe card according to the fourth example embodiment, will be described with reference to FIG. 13. Here, the electrodes 21a and 21b and the wiring 22 in the wiring substrate 2, the pitch conversion electrode 71a and the back surface electrode 71b in the pitch conversion substrate 7, and the second anisotropically conductive sheet 8 that electrically connects the pitch conversion substrate 7 and the wiring substrate 2 are omitted.

Figure 13:
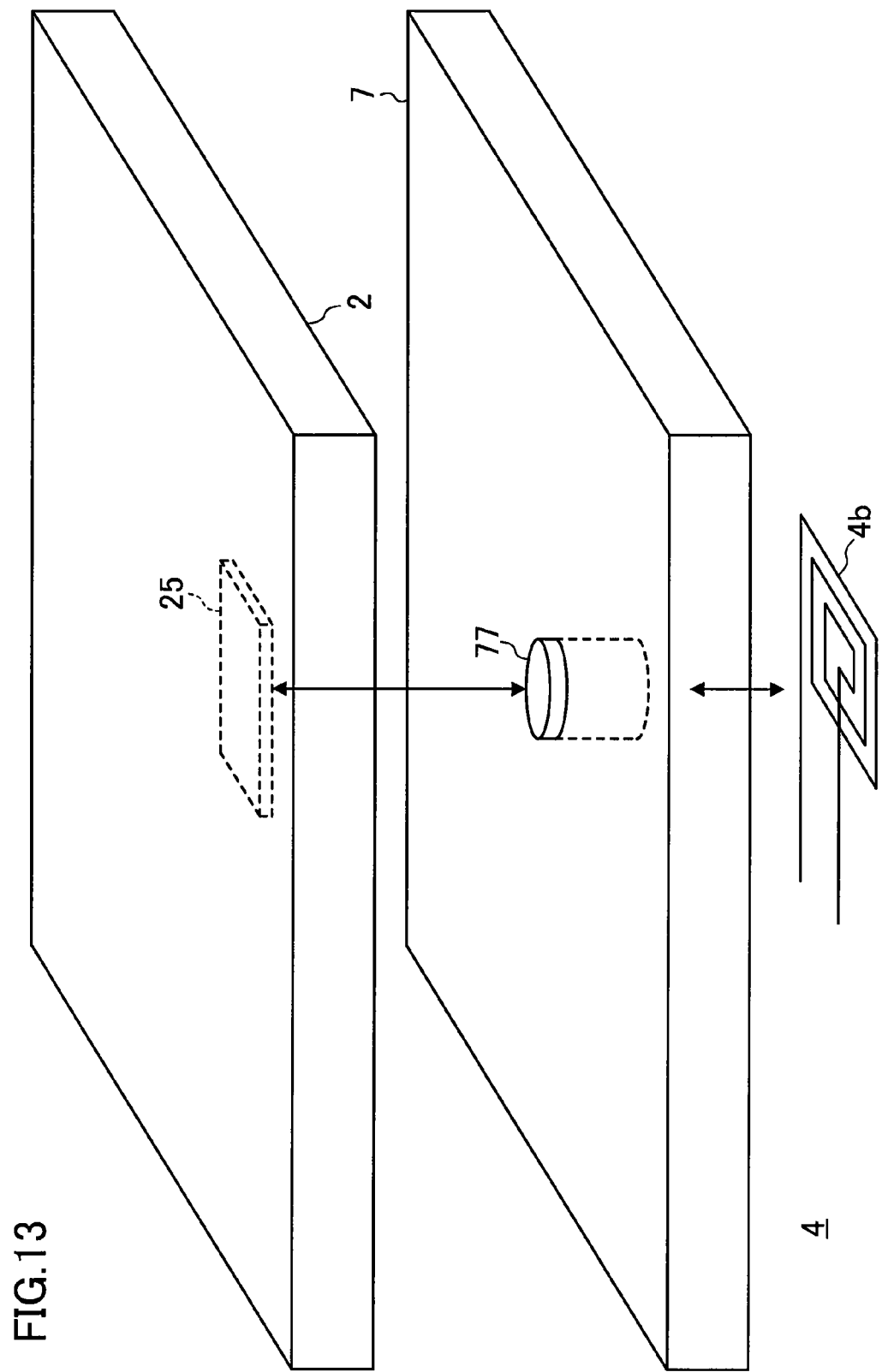
FIG. 13 is a schematic perspective view of a third modification of the pitch conversion substrate, which is the probe card according to the fourth example embodiment.

As shown in FIG. 13, a via 77 containing a magnetic material for inducing a magnetic field is embedded in the direction of penetrating the pitch conversion substrate 7 in the pitch conversion substrate 7 according to the third modification. Thus, a reduction in magnetic field coupling between the non-contact patterns for obtaining inductive coupling formed on a probe chip 25 and the wafer 4 provided on the wiring substrate 2 due to an increase in the distance can be suppressed.

In order to further increase the effect of suppressing the reduction in magnetic field coupling, the via 77 containing a magnetic material preferably projects from the surface of the pitch conversion substrate 7 in the range where the constituent of the probe card 1 is not impaired. Thus, the via 77 is easily brought close to the non-contact pattern of each of the non-contact pad 4b in the wafer 4 and of the probe chip 25 in the wiring substrate 2.

As the magnetic material, in order to achieve high frequency communication, a soft magnetic material having a small residual magnetic field is preferably used.

Fifth Example Embodiment

Hereinafter, an example of the thin film substrate, which is a probe card according to a fifth example embodiment, will be described with reference to FIG. 14.

Figure 14A:
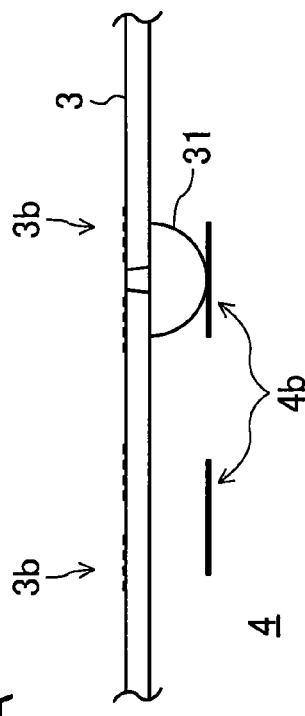
FIG. 14A is a schematic cross sectional view of an example of a thin film substrate, which is a probe card according to a fifth example embodiment.

As shown in FIG. 14A, on the upper surface (wiring substrate side) of the thin film substrate 3, which is the thin film substrate 3 for comparison, two non-contact pattern 3b each containing an inductor are formed. On one of the non-contact pattern 3b, a bump electrode 31 containing a magnetic material and penetrating the thin film base material is formed.

Figure 14B:
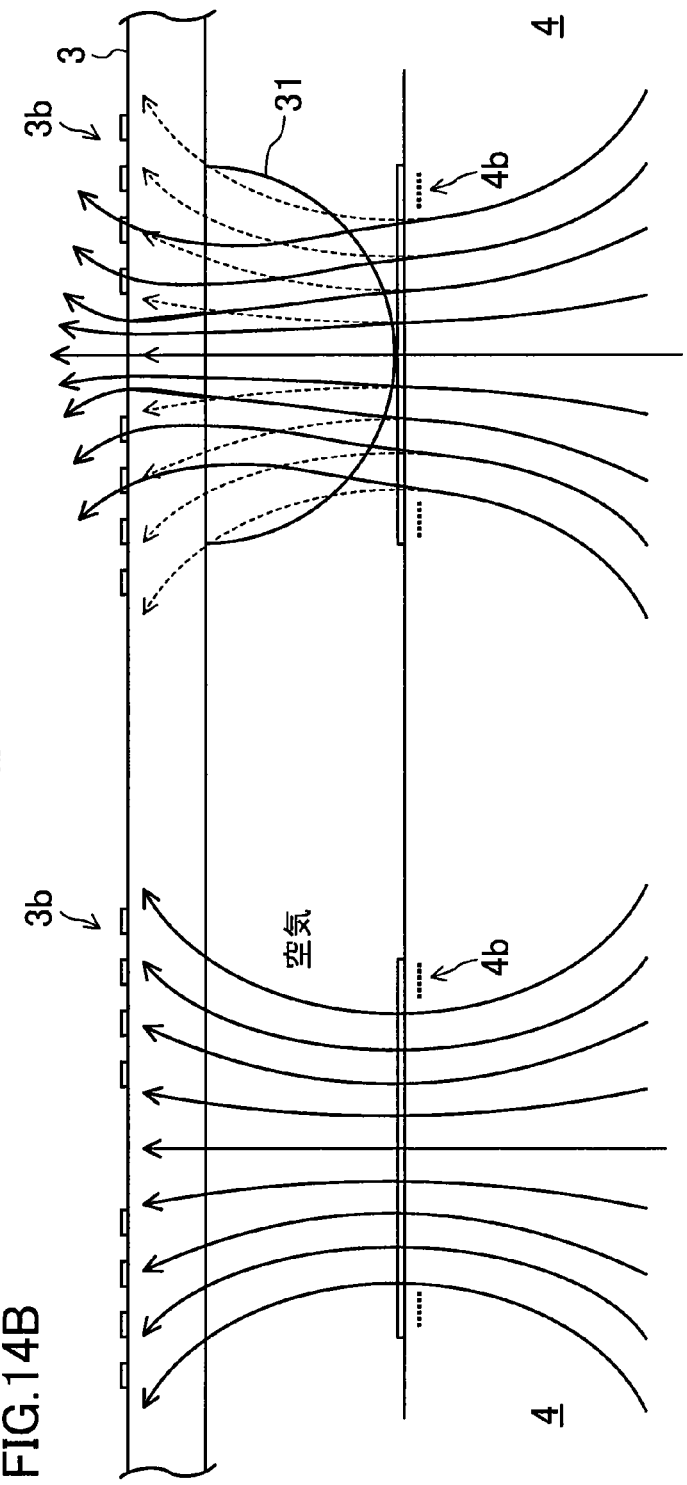
FIG. 14B is an enlarged cross sectional view of FIG. 14A.

As shown in FIG. 14B, when the space between the thin film substrate 3 and the wafers 4 is air, a magnetic flux produced by signals in the inductive non-contact pad 4b provided on the wafer 4 extends as it is apart from the surface of the wafer 4 and a magnetic flux passing through the inside of the non-contact pattern 3b provided on the thin film substrate 3 decreases with an increase in the distance with the wafer 4.

However, as in the fifth example embodiment, by disposing the bump electrode 31 containing a magnetic material, such as nickel, on the axis of the non-contact pad 4b, a magnetic field passes through the inside of the bump electrode 31 containing a magnetic material and the extension of the magnetic flux is suppressed, and thus the inductive coupling can be increased. Thus, weak signals from the wafer 4 are detected, and desired communication can be performed.

Sixth Example Embodiment

Hereinafter, an example of the wiring substrate and the thin film substrate, which is a probe card according to a sixth example embodiment, will be described with reference to FIG. 15.

The probe card 1 according to this disclosure contains the wiring substrate 2 and the thin film substrate 3, and, on the surface facing the thin film substrate 3 in the wiring substrate 2, the electrodes 21a and 21b are formed as shown in FIG. 1.

In the sixth example embodiment, an active device (chip) to be mounted on the wiring substrate 2 will be described. As shown in FIG. 15, the probe chip 25 is mounted on the surface facing the wafer 4 in the wiring substrate 2. Moreover, a tester chip 26 is mounted on the surface opposite to the wafer 4 in the wiring substrate 2. Furthermore, although not shown, passive components, such as a DC/DC converter for power supply, a resistor, and a capacitor, may be mounted on the surface facing the wafer 4 of the wiring substrate 2.

The probe chip 25 formed on the thin film substrate 3 and facing the non-contact pattern 3b containing an inductor, for example, is provided with a driver circuit for performing non-contact communication with the wafer 4 or a circuit for performing sensing, amplification, waveform-shaping, and the like of signals obtained from the wafer 4 by non-contact.

The probe chip 25 may contain one chip and may be connected to one of the semiconductor chips on the wafer 4 by a single signal wire or a plurality of signal wires. A structure of simultaneously communicating with a plurality of semiconductor chips with one chip may be acceptable. Furthermore, a structure such that a plurality of the probe chips 25 communicate with one semiconductor chip may be acceptable. Moreover, the probe chip 25 may have a driver circuit of signals for contact without being limited to the driver for non-contact communication. Furthermore, by providing a comparator, comparative inspection of the obtained signal from the wafer 4 can be performed in the probe chip 25.

The tester chip 26 transmits and receives signals to/from the probe chip 25. One tester chip 26 may be connected to one probe chip 25 or one tester chip 26 may control a plurality of probe chips 25 and transmit and receive signals. The tester chip 26 may control the voltage of a DC/DC converter provided on one wiring substrate 2 and manage the converter. When two or more of the tester chips 26 are mounted on one probe card 1, the plurality of the tester chips 26 simultaneously operate, and thus they are preferably mutually connected to constitute a network.

Thus, in the sixth example embodiment, by disposing the probe chip 25 at the surface facing the wafer 4 of the wiring substrate 2, it can be connected to the non-contact pattern 3b of the thin film substrate 3 without passing through complicated inner layers of the wiring substrate 2. Therefore, a possibility of influence of noise, such as cross talk, can be sharply reduced. In particular, when capacitive coupling is used for non-contact communication, parasitic capacitance ingredients can be sharply reduced, and thus non-contact coupling having a high signal quality can be achieved.

By separating the probe chip 25 from the tester chip 26 for exclusively performing inspection, the mounting area of the back surface (surface opposite to the wafer 4) of the probe card 1 can be effectively utilized.

By limiting the function of the probe chip 25 mainly to transmission and reception of signals, the consumption current of the probe chip 25 can be suppressed. Therefore, it becomes unnecessary to take a special measure against heat dissipation, it can be mounted on the inside of the probe card 1.

First Modification of Sixth Example Embodiment

Hereinafter, a first modification of the wiring substrate, which is a probe card according to the sixth example embodiment, will be described with reference to FIG. 16. Here, only the wiring substrate 2 is shown.

Figure 16:
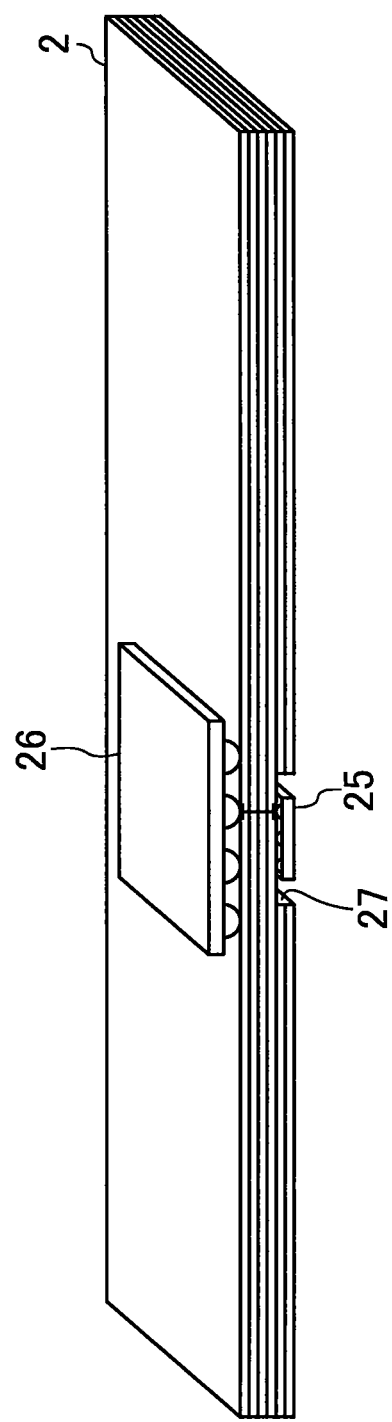
FIG. 16 is a schematic perspective view of a first modification of the wiring substrate, which is the probe card according to the sixth example embodiment.

As shown in FIG. 16, the wiring substrate 2 according to a first modification is characterized in that the probe chip 25 is mounted in a concave portion (hollow) 27 provided on the surface facing the wafer in the wiring substrate 2.

The probe chip 25 preferably does not project from the surface of the wafer side of the wiring substrate 2 in a state where it is mounted on the wiring substrate 2. Accordingly, in the first modification, by mounting the probe chip 25 in the concave portion 27 formed in the surface of the wafer side of the wiring substrate 2, the projection portion formed by mounting the probe chip 25 on the surface of the wafer side of the wiring substrate 2 can be eliminated. Therefore, problems of the thickness of the electrodes 21a provided on the wiring substrate 2 and the thickness of the first anisotropically conductive sheet 6, the second anisotropically conductive sheet, or the like and concern of in-plane uniformity when performing uniform pressurization to the wiring substrate 2 when carrying out each of the first to third example embodiments can be made small.

Second Modification of Sixth Example Embodiment

Hereinafter, a second modification of the wiring substrate, which is the probe card according to the sixth example embodiment, will be described with reference to FIG. 17. Here, only the wiring substrate 2 is shown.

Figure 17:
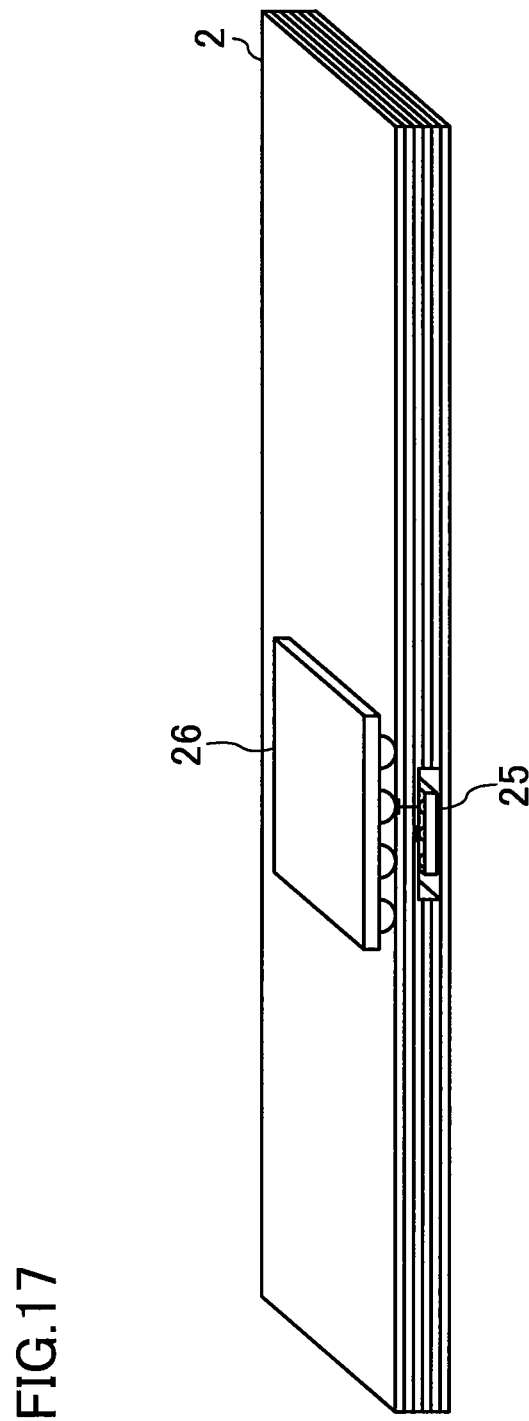
FIG. 17 is a schematic perspective view of a second modification of the wiring substrate, which is the probe card according to a sixth example embodiment.

As shown in FIG. 17, the wiring substrate 2 according to the second modification is characterized in that the probe chip 25 is mounted in the wiring substrate 2.

Figure 15:
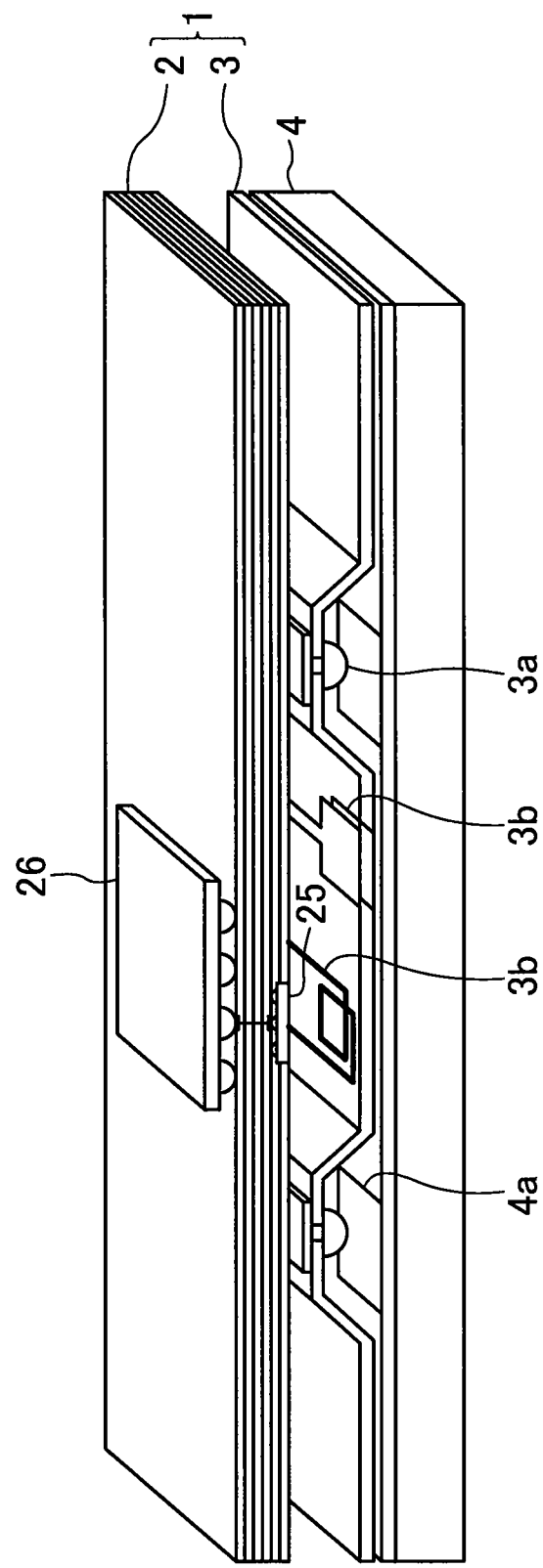
FIG. 15 is a schematic perspective view of an example of a wiring substrate and a thin film substrate, which is a probe card according to a sixth example embodiment.

As described in the sixth example embodiment with reference to FIG. 15, the mounting position of the probe chip 25 is preferably disposed close to the position near the wafer side as much as possible. However, from the viewpoint that the mounting area of the back surface of the wiring substrate 2 is limited in the probe card 1, the probe chip 25 is not necessarily disposed near the wafer side.

In the wiring substrate 2, other functional devices and passive components, such as a capacitor, an inductor, and a resistor, may also be embedded.

Thus, in the second modification, by embedding the probe chip 25 to be mounted on the wiring substrate 2 in the wiring substrate 2, the projection formed by mounting the probe chip 25 on the surface of the wafer side of the wiring substrate 2 can be eliminated. Therefore, problems of the thickness of the electrodes 21a provided on the wiring substrate 2 and the thickness of the first anisotropically conductive sheet 6, the second anisotropically conductive sheet, or the like and concern of in-plane uniformity when performing uniform pressurization to the wiring substrate 2 when carrying out each of the first to third example embodiments can be made small.

As described above, according to the probe card according to the present disclosure and the semiconductor wafer inspection method using the same, when signals are transmitted and received to/from the semiconductor wafer by capacitive coupling or inductive coupling in a non-contact state, the electromagnetic coupling thereof becomes further larger, and thus signals can be stably transmitted and received. Moreover, since the probe card according to this disclosure and the semiconductor wafer inspection method using the same can be used for, for example, burn-in screening, quality can be secured, and they are useful for KGD (Known Good Die) or the like essential for performing high density package, such as SiP (System in Package) or three-dimensional mounting in which a plurality of semiconductor chips are built in one package.

What is claimed is:

1. A probe card, which is formed on a semiconductor wafer and collectively inspects a plurality of semiconductor chips each having a plurality of pad electrodes, the probe card comprising:
a thin film substrate having a plurality of projection electrodes on a first surface facing the semiconductor wafer and at a position facing each of the pad electrodes, a non-contact electrode to be electrically connected to the pad electrodes by capacitive coupling or inductive coupling, and a plurality of first electrodes provided on a second surface opposite to the first surface and electrically connected to each of the projection electrodes and the non-contact electrode; and
a wiring substrate having a plurality of second electrodes disposed at a side opposite to the semiconductor wafer in the thin film substrate and at a position facing the first electrodes, wherein
the wiring substrate and the thin film substrate form a first sealed space and the thin film substrate and the semiconductor wafer form a second sealed space;
by reducing the pressure in the first sealed space and the second sealed space, the first electrodes and the second electrodes are brought into close contact with each other and the pad electrodes and the projection electrodes are brought into close contact with each other; and
the pressure of each of the first sealed space and second sealed space are independently adjusted.

2. The probe card of claim 1, wherein the pressure of the first sealed space is adjusted to be higher than that of the second sealed space.

3. The probe card of claim 1, further comprising:
an anisotropically conductive sheet that is provided between the wiring substrate and the thin film substrate and contains an elastic material conducting in a mutually pressing direction between the first electrode and the second electrode.

4. The probe card of claim 1, further comprising:
a first anisotropically conductive sheet that is provided between the wiring substrate and the thin film substrate and contains an elastic material conducting in a mutually pressing direction of the wiring substrate and the thin film substrate;
a pitch conversion substrate that is provided between the wiring substrate and the first anisotropically conductive sheet and has electrodes facing the first electrodes on the side facing the thin film substrate and electrodes facing the second electrodes on the side facing the wiring substrate; and
a second anisotropically conductive sheet that is provided between the wiring substrate and the pitch conversion substrate and contains an elastic material conducting in a mutually pressing direction of the wiring substrate and the pitch conversion substrate.

5. The probe card of claim 4, wherein
the non-contact electrode is an inductor for probing and each semiconductor chip has an inductor for transmission and reception;
the pitch conversion substrate has a first inductor formed on the side of the semiconductor wafer and a second inductor formed on the side of the wiring substrate and electrically connected to the first inductor;
the first inductor is provided at a position facing the inductor for transmission and reception; and
the second inductor is provided at a position facing the inductor for probing.

6. The probe card of claim 5, wherein the first inductor and the second inductor are connected in such a manner that the mutual current directions are opposite to each other.

7. The probe card of claim 5, wherein the first inductor and the second inductor are disposed in such a manner that the center positions are different from each other in the front-back direction of the pitch conversion substrate.

8. The probe card of claim 5, wherein the pitch conversion substrate contains a magnetic layer at least in a region facing the inductor for transmission and reception.

9. The probe card of claim 4, wherein
the non-contact electrode is an inductor for probing and each semiconductor chip has an inductor for transmission and reception;
the inductor for probing and the inductor for transmission and reception are opposite to each other; and
the pitch conversion substrate has a via containing a magnetic material formed in the direction of penetrating the pitch conversion substrate between the inductor for transmission and reception and the inductor for probing.

10. The probe card of claim 1, wherein
the non-contact electrode is formed on the first surface of the thin film substrate;
the thin film substrate has, on the second surface, a thin film back surface electrode to be electrically connected to the non-contact electrode; and
the thin film back surface electrode is formed at a position apart from the non-contact electrode by a distance at least 10 times the film thickness of the thin film substrate.

11. The probe card of claim 10, wherein the area of the thin film back surface electrode is smaller than the area of the first electrodes connected to the projection electrodes.

12. The probe card of claim 1, wherein
the non-contact electrode is formed on the first surface or the second surface of the thin film substrate and at a position apart from the nearest first electrode of the plurality of the first electrodes by a distance at least 10 times the film thickness of the thin film substrate; and
the thin film substrate has, on the second surface, a thin film back surface electrode directly to be connected to the non-contact electrode.

13. The probe card of claim 12, further comprising:
an anisotropically conductive sheet that is provided between the wiring substrate and the thin film substrate and contains an elastic material conducting in a mutually pressing direction between the first electrodes and the thin film back surface electrode and the second electrodes,
wherein the contact area with the thin film back surface electrode in the anisotropically conductive sheet is smaller than the contact area of the first electrodes connected to the projection electrodes in the anisotropically conductive sheet.

14. The probe card of claim 1, wherein
the non-contact electrode is an inductor for probing and each semiconductor chip has an inductor for transmission and reception;
the inductor for probing and the inductor for transmission and reception are opposite to each other; and
the thin film substrate has, on the first surface, a bump electrode containing a magnetic material formed in such a manner as to penetrate a region where the inductor for probing is formed.

15. The probe card of claim 1, further comprising:
a probe chip that is formed in a region facing the thin film substrate in the wiring substrate and communicates with each semiconductor chip through the non-contact electrode.

16. The probe card of claim 15, wherein the probe chip is disposed in a concave portion formed in a region facing the thin film substrate.

17. The probe card of claim 15, wherein the probe chip is embedded in a region facing the thin film substrate.

* * * * *